United States Patent
Nobe

(10) Patent No.: US 12,451,855 B2
(45) Date of Patent: Oct. 21, 2025

(54) FILTER DEVICE AND RADIO-FREQUENCY FRONT-END CIRCUIT INCLUDING THE SAME

(71) Applicant: Murata Manufacturing Co., Ltd., Nagaokakyo (JP)

(72) Inventor: Ryouta Nobe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 216 days.

(21) Appl. No.: 18/101,710

(22) Filed: Jan. 26, 2023

(65) Prior Publication Data

US 2023/0170870 A1 Jun. 1, 2023

Related U.S. Application Data

(63) Continuation of application No. PCT/JP2021/034149, filed on Sep. 16, 2021.

(30) Foreign Application Priority Data

Sep. 28, 2020 (JP) ................. 2020-161614

(51) Int. Cl.
*H03H 7/01* (2006.01)
*H01F 27/28* (2006.01)
(Continued)

(52) U.S. Cl.
CPC ....... *H03H 7/0115* (2013.01); *H01F 27/2804* (2013.01); *H01F 27/29* (2013.01);
(Continued)

(58) Field of Classification Search
CPC ...... H03H 9/6483; H03H 7/1775; H03H 7/09; H03H 7/0115; H03H 2001/0085;
(Continued)

(56) References Cited

U.S. PATENT DOCUMENTS

2012/0119852 A1* 5/2012 Sasaki .................. H03H 7/42
333/204
2012/0313730 A1 12/2012 Ootsuka
(Continued)

FOREIGN PATENT DOCUMENTS

JP 2012060440 A 3/2012
JP 2019103108 A 6/2019
(Continued)

OTHER PUBLICATIONS

International Search Report in PCT/JP2021/034149, mailed Dec. 7, 2021, 3 pages.
Written Opinion in PCT/JP2021/034149, mailed Dec. 7, 2021, 3 pages.

*Primary Examiner* — John W Poos
(74) *Attorney, Agent, or Firm* — Keating & Bennett, LLP

(57) ABSTRACT

A filter device includes a multilayer body in which multiple dielectric layers are stacked, a ground terminal, and a first LC parallel resonator, a second LC parallel resonator, and a third LC parallel resonator located in the multilayer body and magnetically coupled to each other. The first LC parallel resonator includes a first conductor, the second LC parallel resonator includes a second conductor, and the third LC parallel resonator includes a third conductor. The filter device further includes a connection conductor on a layer different from a layer on which the second conductor is located, a first via including one end connected to the first conductor and another end connected to the connection conductor, and a second via including one end connected to the third conductor and another end connected to the connection conductor. The connection conductor includes a first region that overlaps a portion of the second conductor in plan view of the multilayer body seen in a stacking direction.

18 Claims, 17 Drawing Sheets

(51) Int. Cl.
    *H01F 27/29*     (2006.01)
    *H01G 4/012*     (2006.01)
    *H01G 4/30*     (2006.01)

(52) U.S. Cl.
    CPC ............... *H01G 4/012* (2013.01); *H01G 4/30* (2013.01); *H03H 7/0161* (2013.01); *H01F 2027/2809* (2013.01)

(58) Field of Classification Search
    CPC .... H03H 7/1708; H03H 9/725; H03H 7/1766; H03H 9/605; H03H 7/1758; H03H 7/463; H03H 9/542; H03H 9/706; H03H 1/00; H03H 7/0161; H03H 7/075; H03H 7/38; H03H 7/1791; H03H 7/1725; H03H 7/0138; H03H 9/72; H01P 1/20345; H01P 1/203; H01P 1/205
See application file for complete search history.

(56) References Cited

U.S. PATENT DOCUMENTS

| | | | |
|---|---|---|---|
| 2013/0229241 A1* | 9/2013 | Imamura | H03H 7/1791 |
| | | | 333/185 |
| 2013/0241672 A1* | 9/2013 | Tamaru | H03H 7/0115 |
| | | | 333/175 |
| 2017/0272047 A1 | 9/2017 | Tanaka et al. | |
| 2019/0181826 A1* | 6/2019 | Imamura | H03H 7/1775 |
| 2019/0260343 A1* | 8/2019 | Shiokawa | H01F 17/0013 |

FOREIGN PATENT DOCUMENTS

| | | |
|---|---|---|
| WO | 2012077498 A1 | 6/2012 |
| WO | 2016092903 A1 | 6/2016 |
| WO | 2018092442 A1 | 5/2018 |

\* cited by examiner

FILTER DEVICE AND RADIO-FREQUENCY FRONT-END CIRCUIT INCLUDING THE SAME

CROSS REFERENCE TO RELATED APPLICATIONS

This application claims the benefit of priority to Japanese Patent Application No. 2020-161614 filed on Sep. 28, 2020 and is a Continuation Application of PCT Application No. PCT/JP2021/034149 filed on Sep. 16, 2021. The entire contents of each application are hereby incorporated herein by reference.

BACKGROUND OF THE INVENTION

1. Field of the Invention

The present disclosure relates to a filter device and a radio-frequency front-end circuit including the same and more specifically relates to a technology for improving the characteristics of a multilayer LC filter.

2. Description of the Related Art

International Publication No. 2016/092903 discloses a band-pass filter in a filter device having a configuration in which three or more LC parallel resonators are arranged. In the band-pass filter, two non-adjacent LC parallel resonators are coupled to each other by magnetic field coupling.

In International Publication No. 2016/092903, non-adjacent two LC parallel resonators are coupled to each other by magnetic field coupling to increase the attenuation at an attenuation pole and achieve a band-pass characteristic in which the steepness of the insertion loss at both ends of a pass band is reduced.

SUMMARY OF THE INVENTION

In recent years, signals in various frequency bands have come to be used in communications, and there is a demand for a filter device that can achieve a desired band-pass characteristic while preventing a signal transmitted or received in a specific frequency band from being interfered with a signal in another frequency band.

Preferred embodiments of the present disclosure provide filter devices each including three or more LC parallel resonators and achieving a desired band-pass characteristic by enhancing an adjustability of electromagnetic field coupling between multiple LC parallel resonators.

A filter device according to an aspect of a preferred embodiment of the present disclosure includes a multilayer body in which multiple dielectric layers are stacked in a stacking direction, a ground terminal, and a first LC parallel resonator, a second LC parallel resonator, and a third LC parallel resonator located in the multilayer body and magnetically coupled to each other. Each of the first LC parallel resonator, the second LC parallel resonator, and the third LC parallel resonator is connected to the ground terminal, the first LC parallel resonator includes a first conductor, the second LC parallel resonator includes a second conductor, and the third LC parallel resonator includes a third conductor. The filter device further includes a connection conductor located on a layer that is different from a layer on which the second conductor is located, a first via including one end connected to the first conductor and another end connected to the connection conductor, and a second via including one end connected to the third conductor and another end connected to the connection conductor. The connection conductor includes a first region that overlaps a portion of the second conductor in plan view of the multilayer body seen in the stacking direction.

A filter device according aspect of a preferred embodiment of the present disclosure includes a ground terminal and multiple LC parallel resonators each of which is connected to the ground terminal, the multiple LC parallel resonators being electrically connected to each other. The multiple LC parallel resonators include a first LC parallel resonator, a second LC parallel resonator, and a third LC parallel resonator. Each of the multiple LC parallel resonators includes a first inductor and a second inductor that are connected in series and a first capacitor, and is connected to the ground terminal at a connection node between the second inductor and the first capacitor. The filter device further includes a third inductor and a fourth inductor that are connected in series between a connection node between the first inductor and the second inductor of the first LC parallel resonator and a connection node between the first inductor and the second inductor of the third LC parallel resonator, and a second capacitor connected between a connection node between the first inductor and the second inductor of the second LC parallel resonator and a connection node between the third inductor and the fourth inductor.

A filter device according to a preferred embodiment of the present disclosure includes the first LC parallel resonator, the second LC parallel resonator, and the third LC parallel resonator that are magnetically coupled to each other. The first LC parallel resonator and the third LC parallel resonator are magnetically coupled to each other via the connection conductor. The second LC parallel resonator includes the second conductor. The connection conductor overlaps a portion of the second conductor in plan view of the multilayer body seen in the stacking direction so that the connection conductor is capacitively coupled to the second conductor.

With this configuration, unlike a case in which the connection conductor is not provided, a capacitor is provided between the connection conductor and the second conductor, and an inductor is provided between the first LC parallel resonator and the third LC parallel resonator.

The electromagnetic field coupling between the first LC parallel resonator, the second LC parallel resonator, and the third LC parallel resonator can be adjusted by adjusting the capacitance of the capacitor and the inductance of the inductor, and the capacitance of the capacitor and the inductance of the inductor may be used as parameters of electromagnetic field coupling.

This in turn makes it: possible to enhance the adjustability of electromagnetic field coupling between LC parallel resonators and thus makes it possible to increase the possibility to achieve a desired band-pass characteristic.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
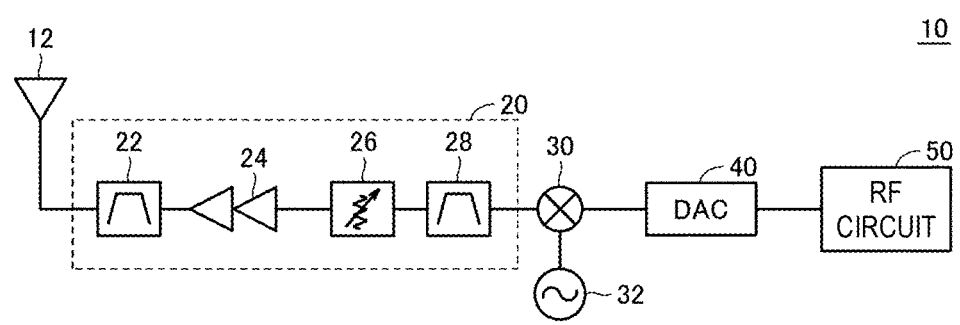
FIG. 1 is a block diagram of a communication apparatus including a radio-frequency front-end circuit for which a filter device of a first preferred embodiment of the present invention is used.

Preferred embodiments of this disclosure are described in detail below with reference to the drawings. The same reference number is assigned to the same or similar components in the drawings, and the descriptions of those components are not repeated.

First Preferred Embodiment

Basic Configuration of Communication Apparatus

FIG. 1 is a block diagram of a communication apparatus 10 including a radio-frequency front-end circuit 20 to which a filter device according to a first preferred embodiment is applied. The communication apparatus 10 is, for example, a mobile phone base station.

Referring to FIG. 1, the communication apparatus 10 includes an antenna 12, a radio-frequency front-end circuit 20, a mixer 30, a local oscillator 32, a D/A converter (DAC) 40, and an RF circuit 50. Also, the radio-frequency front-end circuit 20 includes band-pass filters 22 and 28, an amplifier 24, and an attenuator 26. In FIG. 1, it is assumed that the radio-frequency front-end circuit 20 includes a transmitter circuit that transmits a radio frequency signal from the antenna 12. However, the radio-frequency front-end circuit 20 may include a receiver circuit that receives a radio frequency signal via the antenna 12.

The communication apparatus 10 upconverts a signal transmitted from the RF circuit 50 to a radio frequency signal and emits the radio frequency signal from the antenna 12. A modulated digital signal output from the RF circuit 50 is converted to an analog signal by the D/A converter 40. The mixer 30 mixes the analog signal output from the D/A converter 40 with an oscillation signal from the local oscillator 32 and thus upconverts the analog signal to a radio frequency signal. The band-pass filter 28 removes spurious waves generated as a result of the upconversion to extract only a signal in a desired frequency band. The attenuator 26 adjusts the intensity of a transmission signal. The amplifier 24 amplifies the power of the transmission signal passed through the attenuator 26 to a predetermined level. The band-pass filter 22 removes spurious waves generated in the amplification process and transmits only a signal component in a frequency band specified by a communication standard. The transmission signal passed through the band-pass filter 22 is emitted from the antenna 12.

A filter device according to a preferred embodiment of the present disclosure may be used as each of the band-pass filters 22 and 28 in the communication apparatus 10 described above.

Configuration of Filter Device

Next, a detailed configuration of a filter device 105 of the first preferred embodiment is described with reference to FIGS. 2 and 3.

Figure 2:
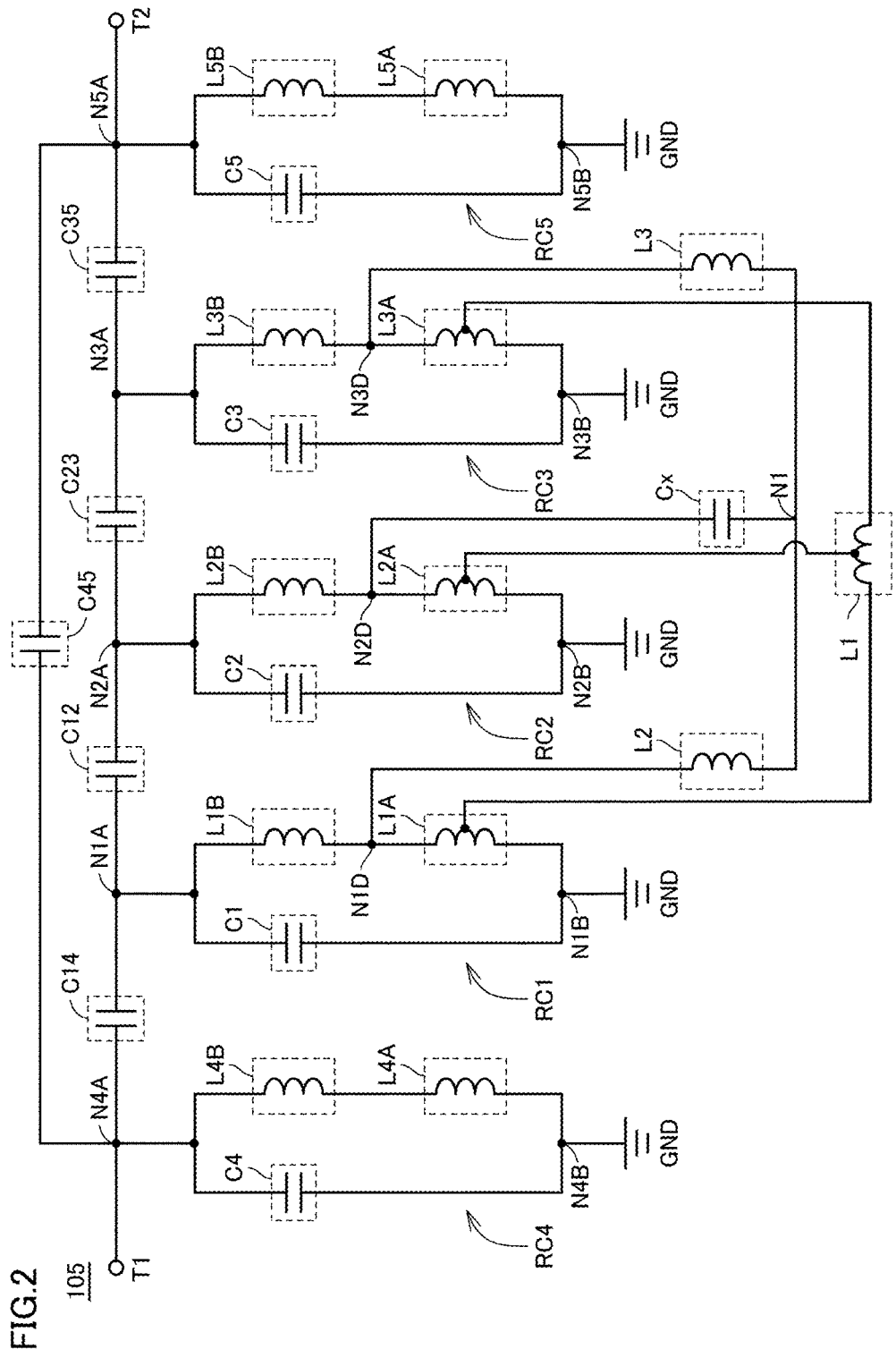
FIG. 2 is an equivalent circuit diagram of the filter device.

FIG. 2 is an equivalent circuit diagram of the filter device 105. Referring to FIG. 2, the filter device 105 includes an input terminal T1, an output terminal T2, and resonators RC1 through RC5.

The resonator RC1 includes inductors L1A and L1B connected in series and a capacitor C1 connected in parallel with the inductors L1A and L1B. A connection node N1A between the inductor L1B and the capacitor C1 is connected via a capacitor C14 to a connection node N4A between an inductor L4B and a capacitor C4. Also, the connection node N1A is connected via a capacitor C12 to a connection node N2A between an inductor L2B and a capacitor C2. A connection node N1B between the inductor L1A and the capacitor C1 is connected to a ground terminal GND.

The resonator RC2 includes inductors L2A and L2B connected in series and the capacitor C2 connected in parallel with the inductors L2A and L2B. The connection node N2A between the inductor L2B and the capacitor C2 is connected via a capacitor C23 to a connection node N3A between an inductor L3B and a capacitor C3. A connection node N2B between the inductor L2A and the capacitor C2 is connected to the ground terminal GND.

The resonator RC3 includes inductors L3A and L3B connected in series and the capacitor C3 connected in parallel with the inductors L3A and L3B. The connection node N3A between the inductor L3B and the capacitor C3 is connected via a capacitor C35 to a connection node N5A between an inductor L5B and a capacitor C5. A connection node N3B between the inductor L3A and the capacitor C3 is connected to the ground terminal GND.

The resonator RC4 includes inductors L4A and L4B connected in series and the capacitor C4 connected in parallel with the inductors L4A and L4B. The connection node N4A between the inductor L4B and the capacitor C4 is connected to the input terminal T1. A connection node N4B between the inductor L4A and the capacitor C4 is connected to the ground terminal GND.

The resonator RC5 includes inductors L5A and L5B connected in series and the capacitor C5 connected in parallel with the inductors L5A and L5B. The connection node N5A between the inductor L5B and the capacitor C5 is connected to the output terminal T2. A connection node N5B between the inductor L5A and the capacitor C5 is connected to the ground terminal GND.

Also, the connection node N4A of the resonator RC4 and the connection node N5A of the resonator RC5 are connected to each other via a capacitor C45. Each of the inductor L1A of the resonator RC1, the inductor L2A of the resonator RC2, and the inductor L3A of the resonator RC3 are connected to an inductor L1.

A connection node N1D of the resonator RC1 is connected to an inductor L2. A connection node N3D of the resonator RC3 is connected to an inductor L3. The inductor L2 and the inductor L3 are connected to each other. A connection node N1 is between the inductor L2 and the inductor L3. The connection node N1 is connected via a capacitor Cx to a connection node N2D between the inductor L2B and the inductor L2A.

Each of the resonators RC1 through RC5 is an LC parallel resonator in which inductors and a capacitor are connected in parallel with each other. The resonators are coupled to each other by magnetic coupling. Thus, the filter device 105 has a configuration in which five stages of resonators, for example, which are magnetically coupled to each other, are located between the input terminal T1 and the output terminal T2. By adjusting the resonant frequency of each of the resonators, the filter device 105 defines and functions as a band-pass filter that transmits a signal in a desired frequency band.

Figure 3:
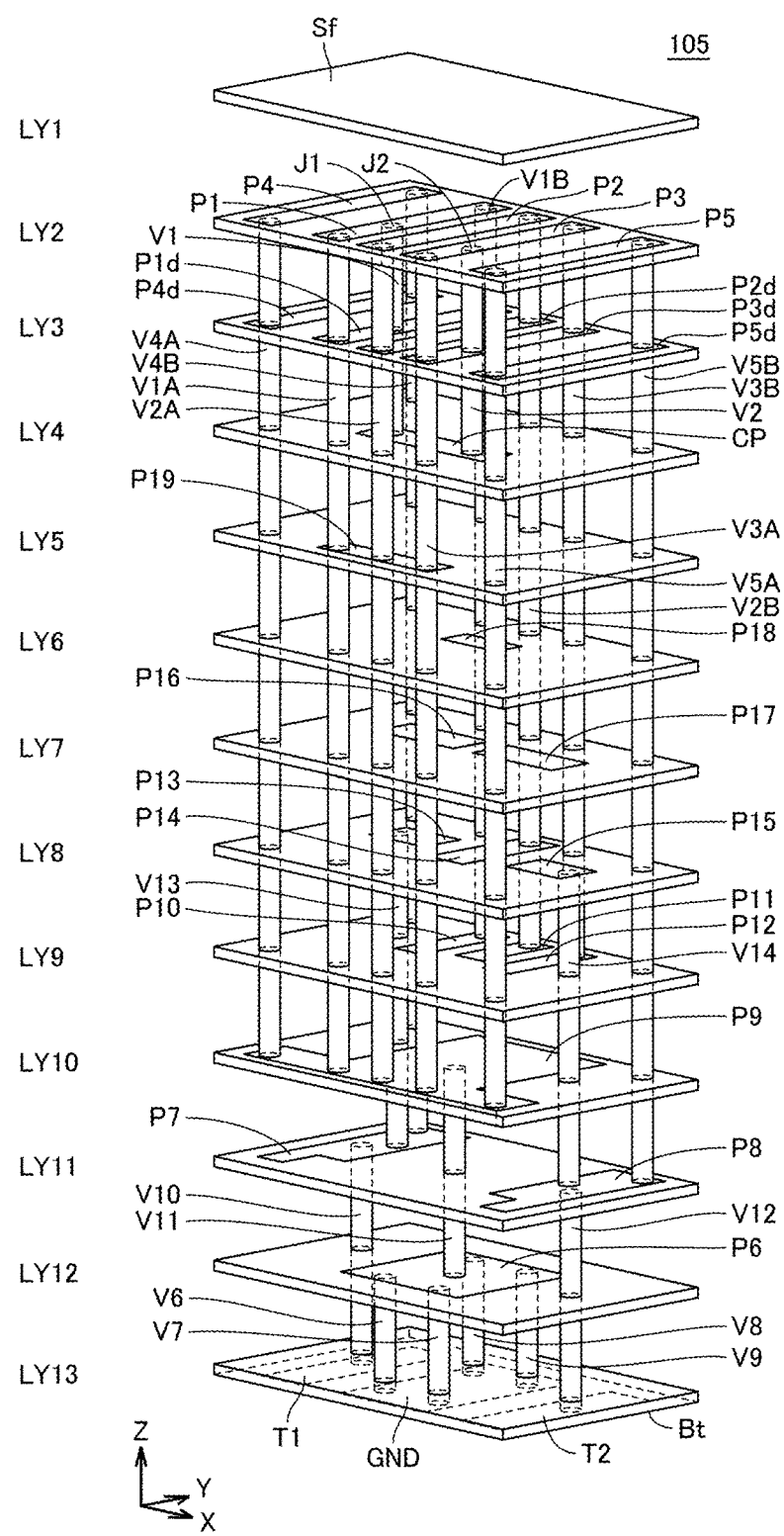
FIG. 3 is an exploded perspective view of an example of a multilayer structure of the filter device.

FIG. 3 is an exploded perspective view of an example of a multilayer structure of the filter device 105. Referring to FIG. 3, the filter device 105 includes a cuboid or substantially cuboid multilayer body formed by stacking multiple dielectric layers (first layer LY1 through thirteenth layer LY13) in a stacking direction. Each dielectric layer of the multilayer body is formed of a ceramic, such as low temperature co-fired ceramics (LTCC), or a resin. Inside of the multilayer body, inductors and capacitors defining LC resonant circuits include multiple electrodes located on respective dielectric layers and multiple vias located between dielectric layers. In this application, a "via" indicates a conductor formed in dielectric layers to connect electrodes located on different dielectric layers. For example, a via is made of a conductive paste, plating, and/or a metal pin.

In the descriptions below, the stacking direction of the multilayer body is referred to as a "Z-axis direction", a direction perpendicular to the Z-axis direction and along the long side of the multilayer body is referred to as an "X-axis direction", and a direction along the short side of the multilayer body is referred to as a "Y-axis direction". Also, in the descriptions below, the positive direction and the negative direction of the Z axis in each drawing may be referred to as "upper" and "lower", respectively.

An orientation mark for identifying the orientation of the filter device 105 may be provided on an upper surface Sf (first layer LY1) of the multilayer body. External terminals (input terminal T1, output terminal T2, and ground terminal GND) to connect the filter device 105 to an external device are provided on a lower surface Bt (thirteenth layer LY13) of the multilayer body. The input terminal T1, the output terminal T2, and the ground terminal GND are planar electrodes and are land grid array (LGA) terminals regularly positioned on the lower surface Bt of the multilayer body.

As described with reference to FIG. 2, the filter device 105 includes five stages of LC parallel resonators, for example. More specifically, the filter device 105 includes a resonator RC1 including vias V1A and V1B, a planar electrode P1, a planar electrode P1d, and a planar electrode P10; a resonator RC2 including vias V2A and V2B, a planar electrode P2, a planar electrode P2d, and a planar electrode P11; a resonator RC3 including vias V3A and V3B, a planar electrode P3, a planar electrode P3d, and a planar electrode P12; a resonator RC4 including vias V4A and V4B, a planar electrode P4, a planar electrode P4d, and a planar electrode P7; and a resonator RC5 including vias V5A and V5B, a planar electrode P5, a planar electrode P5d, and a planar electrode P8.

The planar electrode P7 of the resonator RC4 is located on the eleventh layer LY11. The planar electrode P7 is connected through the via V10 to the input terminal T1 located on the thirteenth layer LY13. The planar electrode P7 of the resonator RC4 is connected through the via V4B to the planar electrode P4d located on the third layer LY3 and the planar electrode P4 located on the second layer LY2. Also, the planar electrode P4 is connected through the via V4A to a planar electrode P9 located on the tenth layer LY10. The planar electrode P9 is connected through a via V11 to a planar electrode P6 located on the twelfth layer LY12. Also, the planar electrode P6 is connected through vias V6, V7, V8, and V9 to the ground terminal GND located on the thirteenth layer LY13. In plan view seen in the stacking direction, a portion of the planar electrode P7 overlaps the planar electrode P9. The capacitor C4 in FIG. 2 includes the planar electrode P9 and the planar electrode P7. Here, the via V4A and the via V4B of the resonator RC4 correspond to the inductor L4A and the inductor L4B in FIG. 2, respectively.

The planar electrode P8 of the resonator RC5 is located on the eleventh layer LY11. The planar electrode P8 is connected through a via V12 to the output terminal T2 located on the thirteenth layer LY13. The planar electrode P8 of the resonator RC5 is connected through the via V5B to the planar electrode P5d located on the third layer LY3 and the planar electrode P5 located on the second layer LY2. Also, the planar electrode P5 is connected through a via V5A to the planar electrode P9. In plan view seen in the stacking direction, a portion of the planar electrode P8 overlaps the planar electrode P9. The capacitor C5 in FIG. 2 includes the planar electrode P8 and the planar electrode P9. Here, the via V5A and the via V5B of the resonator RC5 correspond to the inductor L5A and the inductor L5B in FIG. 2, respectively.

The planar electrode P10 of the resonator RC1 is connected through the via V1B to the planar electrode P1d located on the third layer LY3 and the planar electrode P1 located on the second layer LY2. Also, the planar electrode P1 is connected through the via V1A to the planar electrode P9. In plan view seen in the stacking direction, the planar electrode P10 overlaps a portion of the planar electrode P9. The capacitor C1 in FIG. 2 includes the planar electrode P10 and the planar electrode P9. Here, the via V1A and the via V1B of the resonator RC1 correspond to the inductor L1A and the inductor L1B in FIG. 2, respectively.

The planar electrode P11 of the resonator RC2 is connected through the via V2B to the planar electrode P2d located on the third layer LY3 and the planar electrode P2 located on the second layer LY2. Also, the planar electrode P2 is connected through the via V2A to the planar electrode P9. In plan view seen in the stacking direction, the planar electrode P11 overlaps a portion of the planar electrode P9. The capacitor C2 in FIG. 2 includes the planar electrode P9 and the planar electrode P11. The via V2A and the via V2B of the resonator RC2 correspond to the inductor L2A and the inductor L2B in FIG. 2, respectively.

The planar electrode P12 of the resonator RC3 is connected through the via V3B to the planar electrode P3d located on the third layer LY3 and the planar electrode P3 located on the second layer LY2. Also, the planar electrode P3 is connected through the via V3A to the planar electrode P9. In plan view seen in the stacking direction, the planar electrode P12 overlaps a portion of the planar electrode P9. The capacitor C3 in FIG. 2 includes the planar electrode P9 and the planar electrode P12. Here, the via V3A and the via V3B of the resonator RC3 correspond to the inductor L3A and the inductor L3B in FIG. 2, respectively.

The planar electrodes P1d through P5d are provided to reduce the resistive components of the planar electrodes P1 through P5. That is, in a configuration including the planar electrodes P1d through P5d, compared to a configuration not including the planar electrodes P1d through P5d, the resistance values of the planar electrodes P1 through P5 are reduced. The via V2B of the resonator RC2 is also connected to a planar electrode P14 located on the eighth layer LY8. In plan view seen in the stacking direction, a portion of the planar electrode P14 overlaps each of a planar electrode P16 and a planar electrode P17 located on the seventh layer LY7. Also, in plan view seen in the stacking direction, a portion of the planar electrode P16 overlaps the planar electrode P10 of the resonator RC1 across the eighth layer LY8. The capacitor C12 in FIG. 2 includes the planar electrode P10, the planar electrode P14, and the planar electrode P16. In plan view seen in the stacking direction, a portion of the planar electrode P17 overlaps the planar electrode P12 of the resonator RC3 across the eighth layer LY8. The capacitor C23 in FIG. 2 includes the planar electrode P12, the planar electrode P14, and the planar electrode P17.

In plan view seen in the stacking direction, a portion of a planar electrode P13 connected through a via V13 to the planar electrode P7 of the resonator RC4 overlaps the planar electrode P16. In plan view seen in the stacking direction, a portion of a planar electrode P15 connected through a via V14 to the planar electrode P8 of the resonator RC5 overlaps the planar electrode P17. In plan view seen in the stacking direction, each of a portion of the planar electrode P16 and a portion of the planar electrode P17 overlaps a planar electrode P18 located on the sixth layer LY6. The capacitor C45 in FIG. 2 includes the planar electrode P13, the planar electrode P15, the planar electrode P16, the planar electrode P17, and the planar electrode P18.

The planar electrode P7 of the resonator RC4 is connected through the via V13 to the planar electrode P13 located on the seventh layer LY7. In plan view seen in the stacking direction, a portion of the planar electrode P13 overlaps the planar electrode P10 of the resonator RC1. The capacitor C14 in FIG. 2 includes the planar electrode P10 and the planar electrode P13.

The planar electrode P8 of the resonator RC5 is connected through the via V14 to the planar electrode P15 located on the seventh layer LY7. In plan view seen in the stacking direction, a portion of the planar electrode P15 overlaps the planar electrode P12 of the resonator RC3. The capacitor C35 in FIG. 2 includes the planar electrode P12 and the planar electrode P15.

Each of the via V1A of the resonator RC1, the via V2A of the resonator RC2, and the via V3A of the resonator RC3 is connected to a planar electrode P19 located on the fifth layer LY5. The planar electrode P19 corresponds to the inductor L1 in FIG. 2.

The planar electrode P1 of the resonator RC1 is connected through the via V1 to the connection electrode CP located on the fourth Layer LY4. Also, the planar electrode P3 of the resonator RC3 is connected through a via V2 to the connection electrode CP. The via V1 and the via V2 correspond to the inductor L2 and the inductor L3 in FIG. 2, respectively. In plan view seen in the stacking direction, a portion of the connection electrode CP overlaps the planar electrode P2d of the resonator RC2. The capacitor Cx in FIG. 2 includes the connection electrode CP and the planar electrode P2d.

The via V1 is connected to the planar electrode P1 at a joint J1. In plan view of the multilayer body seen in the stacking direction, the joint between the via V1 and the planar electrode P1d overlaps the joint J1. The via V2 is connected to the planar electrode P3 at a joint J2. In plan view of the multilayer body seen in the stacking direction, the joint between the via V2 and the planar electrode P3d overlaps the joint J2.

Here, the resonators RC1 through RC5 correspond to "first LC parallel resonator" through "fifth LC parallel resonator", respectively. The planar electrodes P1d through P5d correspond to "first conductor" through "fifth conductor", respectively. The vias V1 and V2 correspond to "first via" and "second via", respectively. The connection electrode CP corresponds to "connection conductor".

In the filter device 105 described with reference to FIG. 3, it is possible to increase and decrease the area of the connection electrode CP overlapping the planar electrode P2d in plan view and thus adjust the capacitance of the capacitor Cx by changing the width of the connection electrode CP. Here, the width of the connection electrode CP indicates the width of the connection electrode CP in the Y-axis direction on the XY plane of the second layer LY2. In the descriptions below, this width may be referred to simply as the width of the connection electrode CP. Also, in the filter device 105, it is possible to change the strength of magnetic coupling between the resonators RC1 and RC3 and thereby adjust the inductances of the inductors L2 and L3 by moving the positions of the joints J1 and J2 in the Y-axis direction.

That is, because the filter device 105 includes the connection electrode CP, it is possible to adjust the capacitance of the capacitor Cx in FIG. 2 by changing the width of the connection electrode CP and to adjust the inductances of the inductors L2 and L3 in FIG. 2 by changing the position of the connection electrode CP. In other words, the capacitance of the capacitor Cx and the inductances of the inductors L2 and L3 can be used as parameters to adjust the strength of electromagnetic field coupling between resonators.

Figure 4:
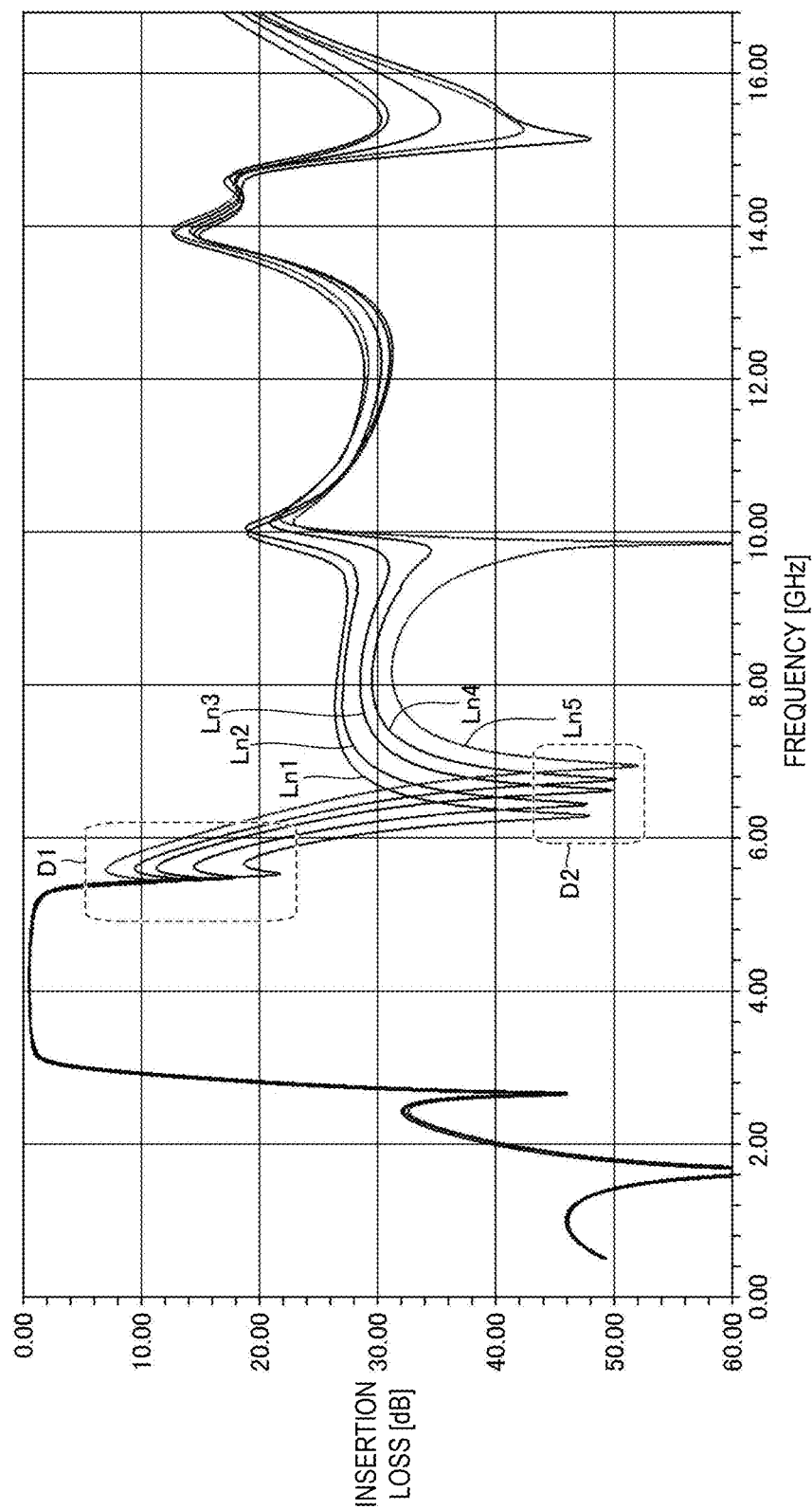
FIG. 4 is a drawing showing insertion losses between an input terminal and an output terminal observed by changing the positions of joints in the filter device illustrated in FIG. 2 and FIG. 3.
Figure 5:
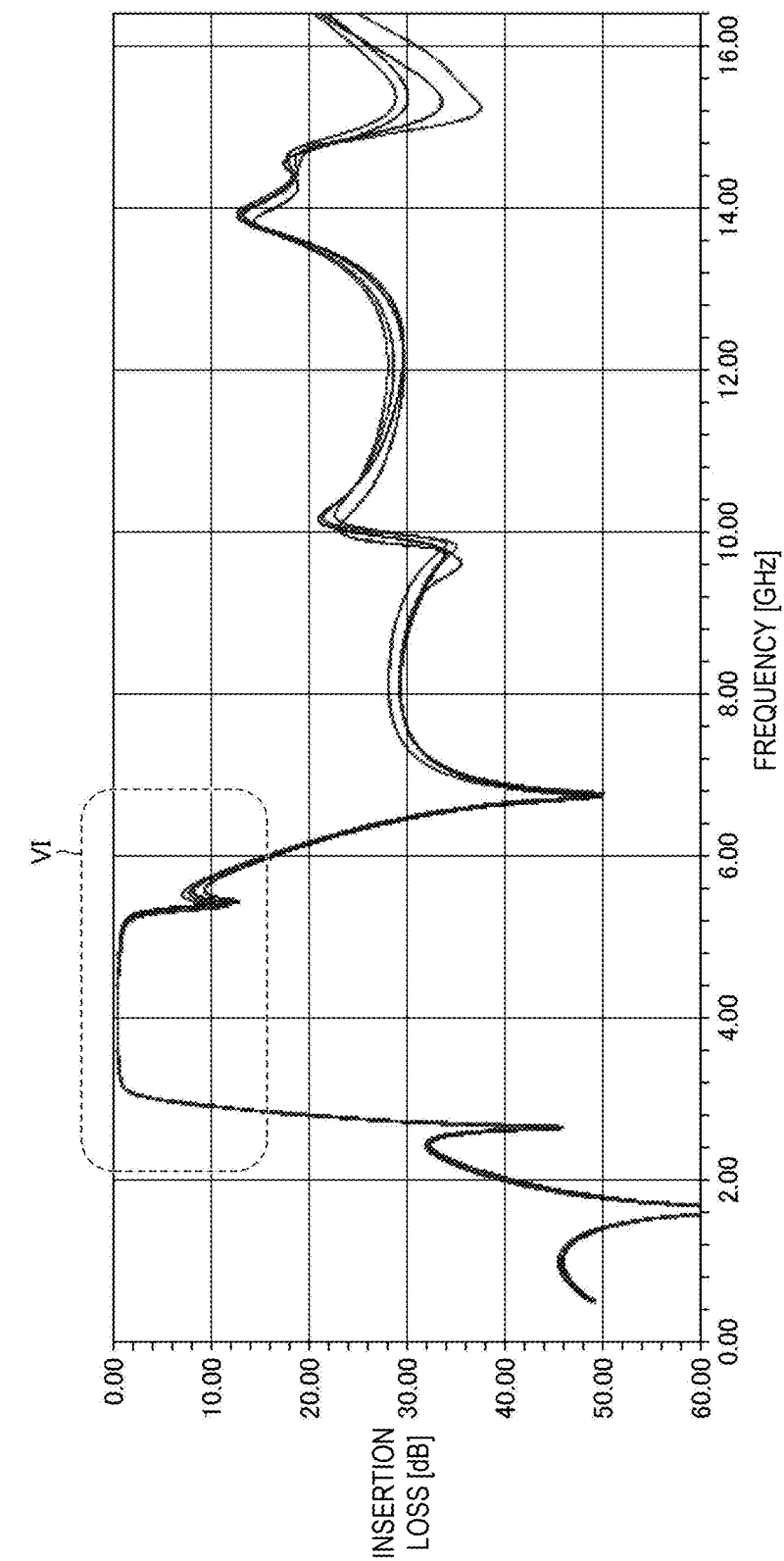
FIG. 5 is a drawing showing insertion losses between an input terminal and an output terminal observed by changing the width in a Y-axis direction of a connection electrode in the filter device illustrated in FIG. 2 and FIG. 3.
Figure 6:
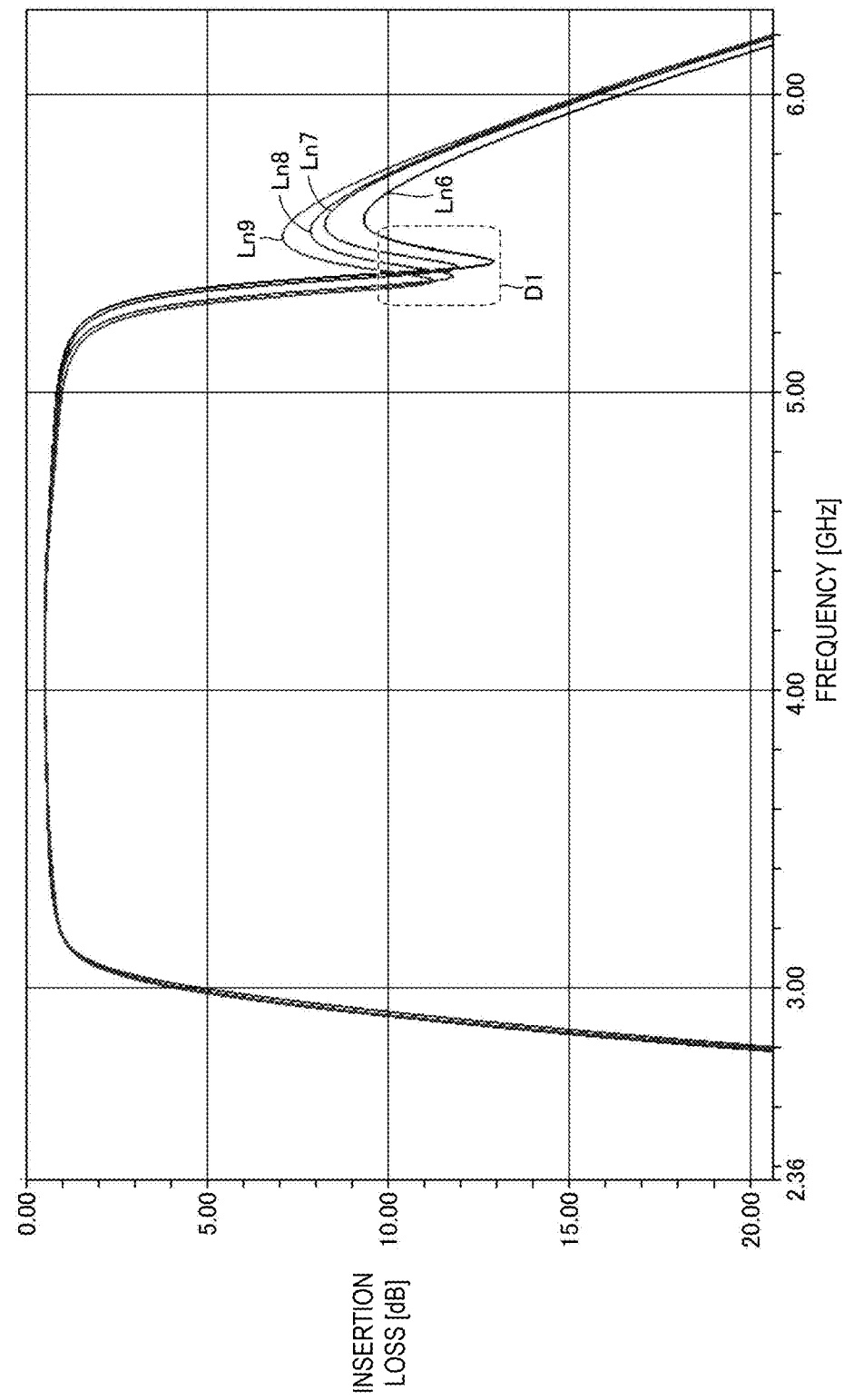
FIG. 6 is an enlarged view of a region shown in FIG. 5.

Next, by referring to FIGS. 4 through 6, examples of adjusting electromagnetic field coupling by changing the positions of the joints J1 and J2 and the width of the connection electrode CP in the filter device 105 of the first preferred embodiment are described.

FIG. 4 is a drawing showing insertion losses between the input terminal T1 and the output terminal T2 observed by changing the position of the joint J1 on the planar electrode P1 and the position of the joint J2 on the planar electrode P3 in the filter device 105 illustrated in FIGS. 2 and 3. Changing the positions of the joints J1 and J2 indicates changing the positions of the via V1, the connection electrode CP, and the via V2 to slide in the Y-axis direction while maintaining the shapes of the via V1, the connection electrode CP, and the via V2 illustrated in FIG. 3. In FIG. 4, solid lines Ln1 through Ln5 indicate insertion losses of the filter device 105 observed by changing the positions of the joints J1 and J2.

The solid line Ln3 indicates an insertion loss observed when the joints J1 and J2 are positioned near the centers of the planar electrodes P1 and P2 in the Y-axis direction. The solid line Ln2 indicates an insertion loss observed when the joints J1 and J2 are shifted in the negative direction of the Y axis from the positions of the joints J1 and J2 in the case of the solid line Ln3. The solid line Ln1 indicates an insertion loss observed when the joints J1 and J2 are shifted further in the negative direction of the Y axis from the positions of the joints J1 and J2 in the case of the solid line Ln2.

The solid line Ln4 indicates an insertion loss observed when the joints J1 and J2 are shifted in the positive direction of the Y axis from the positions of the joints J1 and J2 in the case of the solid line Ln3. The solid line Ln5 indicates an insertion loss observed when the joints J1 and J2 are shifted further in the positive direction of the Y axis from the positions of the joints J1 and J2 in the case of the solid line Ln2.

Referring to FIG. 4, each of the solid lines Ln1 through Ln5 has an attenuation pole D1 and an attenuation pole D2. In the filter device 105 of FIG. 2 and FIG. 3, the magnetic coupling between the resonators RC1 through RC3 is greater than the capacitive coupling between the resonators RC1 through RC3. Therefore, the attenuation poles D1 and D2 are generated in a frequency band higher than the pass band.

As the positions of the joints J1 and J2 move in the negative direction of the Y axis, the positions of the joints J1 and J2 become closer to the ground terminal GND, and the magnetic coupling between the resonator RC1 and the resonator RC3 decreases. Accordingly, the attenuation at the attenuation pole D1 increases, and the frequency of the attenuation pole D2 becomes lower.

As the positions of the joints J1 and J2 move in the positive direction of the Y axis, the positions of the joints J1 and J2 become closer to the input terminal T1, and the magnetic coupling between the resonator RC1 and the resonator RC3 increases. Therefore, the attenuation at the attenuation pole D1 decreases, and the frequency of the attenuation pole D2 becomes higher.

When the positions of the joints J1 and J2 are changed, the inductances of the inductor L2 and the inductor L3 change, and the frequency of the attenuation pole D2 changes. As the frequency of the attenuation pole D2 changes, the attenuation at the attenuation pole D1 changes. That is, when the frequency of the attenuation pole D2 becomes lower, the frequency of the attenuation pole D2 becomes closer to the frequency of the attenuation pole D1. As the frequency difference between the attenuation pole D1 and the attenuation pole D2 becomes smaller, the attenuation pole D1 is more strongly influenced by the attenuation pole D2, and the attenuation at the attenuation pole D1 increases. In contrast, as the frequency difference between the attenuation pole D1 and the attenuation pole D2 increases, the attenuation pole D1 is less strongly influenced by the attenuation pole D2, and the attenuation at the attenuation pole D1 decreases.

Thus, in the filter device 105 of the first preferred embodiment, by changing the positions of the joints J1 and J2 on the planar electrode P1 and the planar electrode P2 in the Y-axis direction, the inductances of the inductor L2 and the inductor L3 can be changed, and the attenuation at the attenuation pole D1 and the frequency band of the attenuation pole D2 can be adjusted.

FIG. 5 is a drawing showing insertion losses between the input terminal T1 and the output terminal T2 observed by changing the width of the connection electrode CP, i.e., the capacitance of the capacitor Cx in the filter device 105 illustrated in FIG. 2 and FIG. 3. FIG. 6 is an enlarged view of a region VI shown in FIG. 5. In FIG. 5 and FIG. 6, solid lines Ln6 through Ln9 indicate insertion losses of the filter device 105 observed by changing the width of the connection electrode CP in the Y-axis direction.

Referring to FIG. 6, the solid line Ln6 indicates an insertion loss of the filter device 105 in FIG. 3. The solid line Ln7 indicates an insertion loss observed when the width of the connection electrode CP is wider than the width of the connection electrode CP of the filter device 105 in FIG. 3. The solid line Ln8 indicates an insertion loss observed when the width of the connection electrode CP is wider than the width of the connection electrode CP in the case of the solid line Ln7. The solid line Ln9 indicates an insertion loss observed when the width of the connection electrode CP is wider than the width of the connection electrode CP in the case of the solid line Ln8.

The attenuation poles D1 indicated by the solid lines Ln6 through Ln9 are generated at positions that are different from each other. As the width of the connection electrode CP in the Y-axis direction increases, the attenuation at the attenuation pole D1 decreases. Also, as the width of the connection electrode CP in the Y-axis direction decreases, the attenuation at the attenuation pole D1 increases.

The capacitor Cx in FIG. 2 includes the connection electrode CP and the planar electrode P2d in FIG. 3. That is, when the width of the connection electrode CP in the Y-axis direction is changed, the capacitance of the capacitor Cx changes. This results in a change in the attenuation at the attenuation pole D1.

Thus, with the filter device 105 of the first preferred embodiment, the attenuation and the frequency of the attenuation pole can be adjusted by changing the width and the position of the connection electrode CP.

With the filter device 105 of this disclosure, at least one of the attenuation and the frequency of the attenuation pole can be adjusted by adjusting the capacitance of the capacitor Cx and the inductances of the inductor L2 and the inductor L3. That is, in the filter device 105 of this disclosure, the capacitance of the capacitor Cx and the inductances of the inductor L2 and the inductor L3 can be used as parameters of electromagnetic field coupling between resonators. This in turn makes it possible to enhance the adjustability of electromagnetic field coupling between LC parallel s and thus makes it possible to increase the possibility to achieve a desired band-pass characteristic.

Second Preferred Embodiment

In the first preferred embodiment, the filter device 105 including five stages of LC parallel resonators, for example, is described. The five stages of LC parallel resonators include the connection electrode CP that connects the resonator RC1 to the resonator RC2. In a second preferred embodiment, for example, three stages of LC parallel resonators including a connection electrode CPt connecting a resonator RC1 to a resonator RC3 are described with reference to FIG. 7 and FIG. 8.

Figure 7:
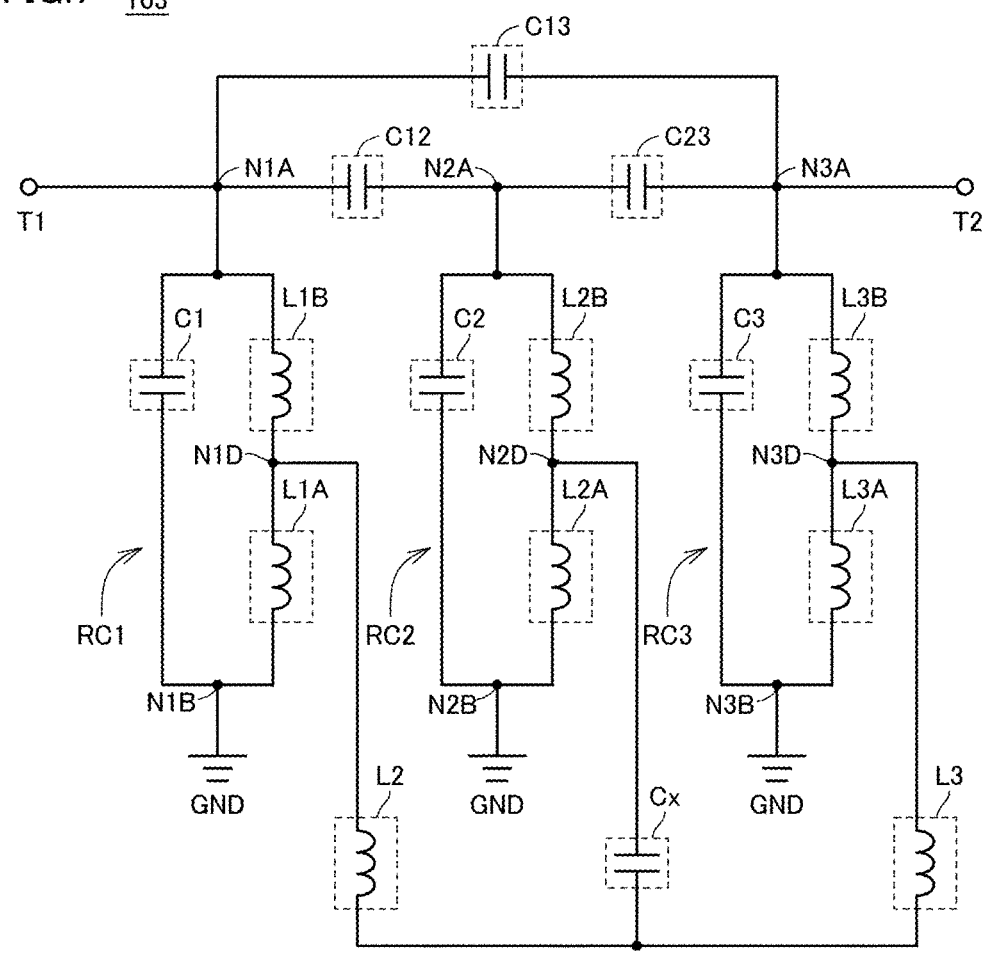
FIG. 7 is an equivalent circuit diagram of a filter device according to a second preferred embodiment of the present invention.

FIG. 7 is an equivalent circuit diagram of a filter device 103 according to the second preferred embodiment. The filter device 103 in FIG. 7 has a configuration obtained by removing the resonator RC4 and the resonator RC5 from the filter device 105 in FIG. 2. That is, the filter device 103 has a configuration including three stages of resonators RC1 through RC3 that are magnetically coupled to each other. Also, the filter device 103 in FIG. 7 has a configuration obtained by removing, from the filter device 105 in FIG. 2, the inductor L1 that connects a connection node N1C, a connection node N2C, and a connection node N3C to each other. The connection node N1A between the capacitor C1 and the inductor L1B is connected to the connection node N3A between the capacitor C3 and the inductor L3B via a capacitor C13.

Thus, at least one of the attenuation and the frequency of the attenuation pole can be adjusted by changing the positions of the joints J1 and J2 and the width of the connection electrode CP even with the configuration excluding the resonator RC4, the resonator RC5, and the inductor L1.

Figure 8:
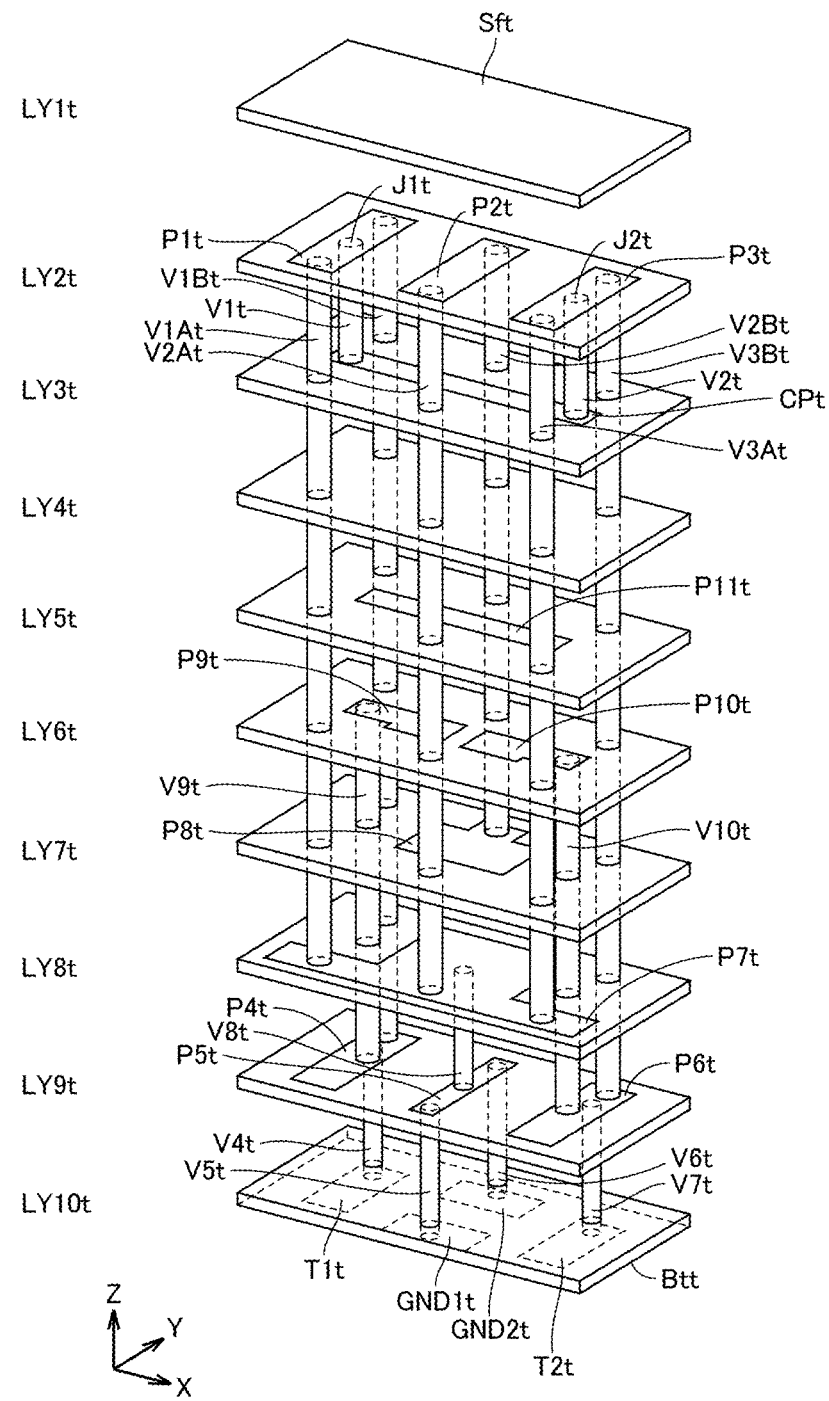
FIG. 8 is an exploded perspective view of an example of a multilayer structure of the filter device according to the second preferred embodiment of the present invention.

FIG. 8 is an exploded perspective view of an example of a multilayer structure of the filter device 103 according to the second preferred embodiment.

Referring to FIG. 8, the filter device 103 has a cuboid or substantially cuboid multilayer body formed by stacking multiple dielectric layers (first layer LY1t through tenth layer LY10t) in a stacking direction.

An orientation mark to identify the orientation of the filter device 103 may be provided on an upper surface Sft (first layer LY1t) of the multilayer body. External terminals (input terminal T1t, output terminal T2t, and ground terminals GND1t and GND2t) to connect the filter device 103 to an external device are provided on a lower surface Btt (tenth layer LY10t) of the multilayer body.

As described with reference to FIG. 7, the filter device 103 includes three stages of LC parallel resonators, for example. More specifically, the filter device 103 includes the resonator RC1 including vias V1At and V1Bt, a planar electrode P1t, and a planar electrode P4t, the resonator RC2 including vias V2At and V2Bt, a planar electrode P2t and a planar electrode P8t, and the resonator RC3 including vias V3At and V3Bt, a planar electrode P3t, and a planar electrode P6t.

The planar electrode P4t of the resonator RC1 is located on the ninth layer LY9t. The planar electrode P4t is connected through a via V4t to the input terminal T1t located on the tenth layer LY10t. The planar electrode P4t of the resonator RC1 is connected through the via V1Bt to the planar electrode P1t located on the second layer LY2t. Also, the planar electrode P1t is connected through a via V1At to a planar electrode P7t located on the eighth layer LY8t. The planar electrode P7t is connected through a via V8t to a planar electrode P5t located on the ninth layer LY9t. Also, the planar electrode P5t is connected through vias V5t and V6t to the ground terminals GND1t and GND2t located on the tenth layer LY10t. In plan view seen in the stacking direction, a portion of the planar electrode P4t overlaps the planar electrode P7t. The capacitor C1 in FIG. 7 includes the planar electrode P4t and the planar electrode P7t. The via V1At and the via V1Bt of the resonator RC1 correspond to the inductor L1A and the inductor L1B in FIG. 7, respectively.

The planar electrode P8t of the resonator RC2 is connected through the via V2Bt to the planar electrode P2t located on the second layer LY2t. Also, the planar electrode P2t is connected through the via V2At to the planar electrode P7t. In plan view seen in the stacking direction, a portion of the planar electrode P7t overlaps the planar electrode P8t. The capacitor C2 in FIG. 7 includes the planar electrode Pt and the planar electrode P8t. The via V2At and the via V2Bt of the resonator RC2 correspond to the inductor L2A and the inductor L2B in FIG. 7, respectively.

The planar electrode P6t of the resonator RC3 is located on the ninth layer LY9t. The planar electrode P6t is connected through a via V7t to the output terminal T2t located on the tenth layer LY10t. The planar electrode P6t is connected through the via V3Bt to the planar electrode P3t located on the second layer LY2t. Also, the planar electrode P3t is connected through the via V3At to the planar electrode P7t. In plan view seen in the stacking direction, a portion of the planar electrode Pt overlaps the planar electrode P6t. The capacitor C3 in FIG. 7 includes the planar electrode P6t and the planar electrode P7t. The via V3At and the via V3Bt of the resonator RC3 correspond to the inductor L3A and the inductor L3B in FIG. 7, respectively.

In plan view seen in the stacking direction, a portion of the planar electrode P8t of the resonator RC2 overlaps a planar electrode P9t located on the sixth layer LY6t. The planar electrode P9t is connected through a via V9t to the planar electrode P4t of the resonator RC1. The capacitor C12 in FIG. 7 includes the planar electrode P8t and the planar electrode P9t. In plan view seen in the stacking direction, a portion of the planar electrode P8t of the resonator RC2 overlaps a planar electrode P10t located on the sixth layer LY6t. The planar electrode P10t is connected through a via V10t to the planar electrode P6t of the resonator RC3. The capacitor C23 in FIG. 7 includes the planar electrode P8t and the planar electrode P10t. In plan view seen in the stacking direction, a planar electrode P11t located on the fifth layer LY5t overlaps each of the planar electrode P9t and the planar electrode P10t. The capacitor C13 in FIG. 7 includes the planar electrode P9t, the planar electrode P10t, and the planar electrode P11t.

The planar electrode P1t of the resonator RC1 is connected through a via Vit to the connection electrode CPt located on the third layer LY3t. Also, the planar electrode P3t of the resonator RC3 is connected through a via V2t to the connection electrode CPt. The via Vit and the via V2t correspond to the inductor L2 and the inductor L3 in FIG. 7, respectively. In plan view seen in the stacking direction, a portion of the connection electrode CPt overlaps the planar electrode P2t of the resonator RC2. The capacitor Cx in FIG. 7 includes the connection electrode CPt and the planar electrode P2t. The via Vit is connected to the planar electrode P1t at a joint J1t. The via V2t is connected to the planar electrode P3t at a joint J2t.

Next, examples of adjusting the electromagnetic field coupling between resonators in the filter device 103 of the second preferred embodiment by changing at least one of the positions of the joints J1t and J2t and the width in the Y-axis direction of the connection electrode CPt are described with reference to FIGS. 9 through 11.

Figure 9:
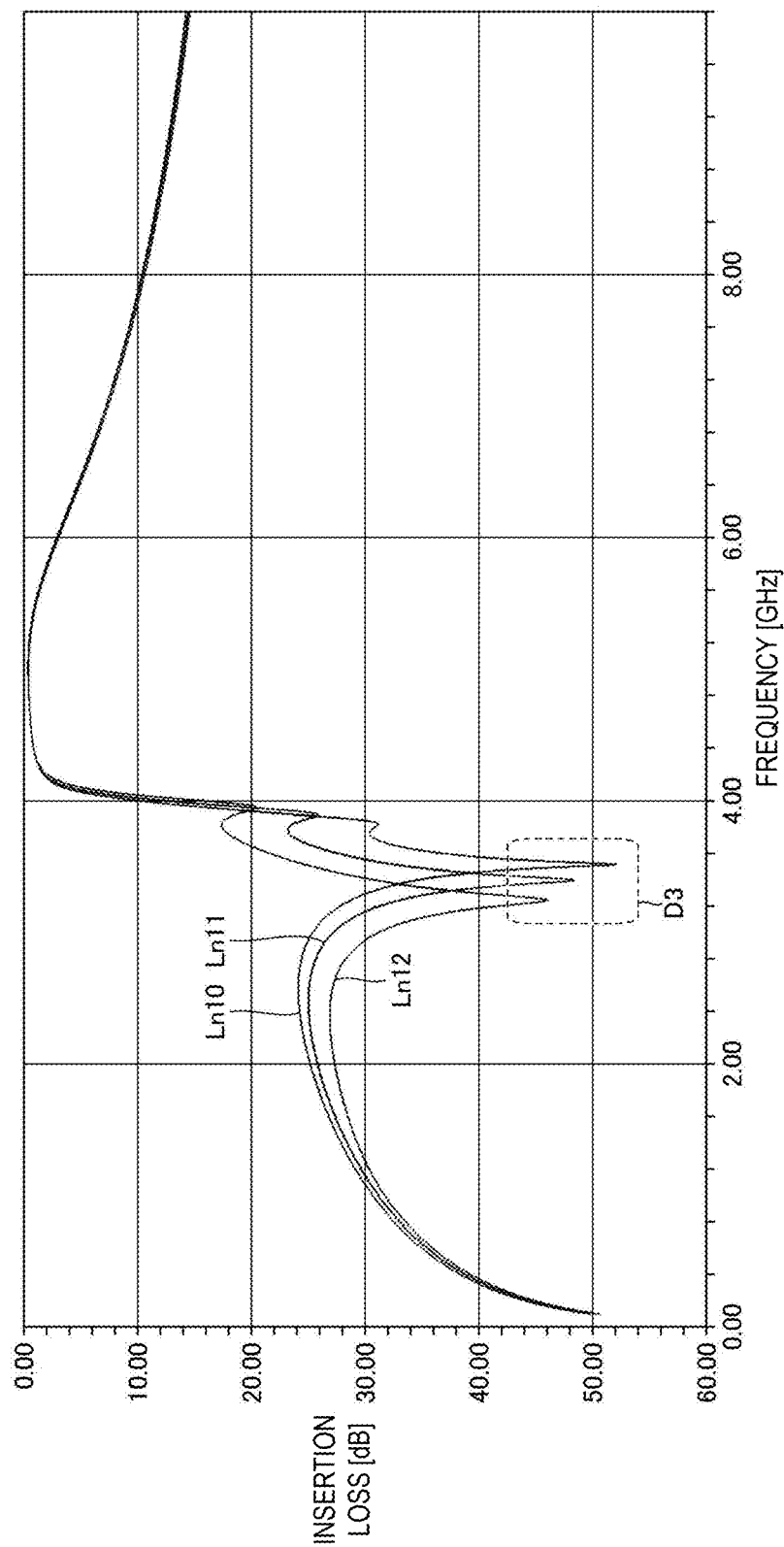
FIG. 9 is a drawing showing insertion losses between an input terminal and an output terminal observed by changing the positions of joints in the filter device illustrated in FIG. 7 and FIG. 8.

FIG. 9 shows insertion losses between the input terminal T1t and the output terminal T2t observed by changing the positions of the joints J1t and J2t in the filter device 103 illustrated in FIGS. 7 and 8. In FIG. 9, solid lines Ln10 through Ln12 indicate insertion losses of the filter device 103 observed by changing the positions of the joints J1t and J2t.

The solid line Ln11 indicates an insertion loss observed when the joints J1t and J2t are positioned near the centers of the planar electrode P1t and the planar electrode P3t in the Y-axis direction. The solid line Ln10 indicates an insertion loss observed when the joints J1t and J2t are shifted in the negative direction of the Y axis from the positions of the joints J1t and J2t in the case of solid line Ln10. The solid line Ln12 indicates an insertion loss observed when the joints J1t and J2t are shifted in the positive direction of the Y axis from the positions of the joints J1t and J2t in the case of the solid line Ln11.

Each of the solid lines Ln10 through Ln12 has an attenuation pole D3. In the filter device 103 of FIG. 7 and FIG. 8, the capacitive coupling between the resonators RC1 through RC3 is greater than the magnetic coupling between the resonators RC1 through RC3. Therefore, the attenuation pole D3 is generated in a frequency band lower than the pass band.

As the positions of the joints J1*t* and J2*t* move in the negative direction of the Y axis, the attenuation at the attenuation pole D3 increases, and the frequency of the attenuation pole D3 becomes higher. Also, as the positions of the joints J1*t* and J2*t* move in the positive direction of the Y axis, the attenuation at the attenuation pole D3 decreases, and the frequency of the attenuation pole D3 becomes lower.

Thus, when the positions of the joints J1*t* and J2*t* are changed, the inductances of the inductor L2 and the inductor L3 in FIG. 7 change. As a result, the frequency of the attenuation pole D3 changes.

Thus, in the filter device 103 of the second preferred embodiment, by changing the positions of the joints J1*t* and J2*t* on the planar electrode P1*t* and the planar electrode P3*t* in the Y-axis direction, the inductances of the inductor L2 and the inductor L3 can be changed, and the attenuation and the frequency band of the attenuation pole D3 can be adjusted.

Figure 10:
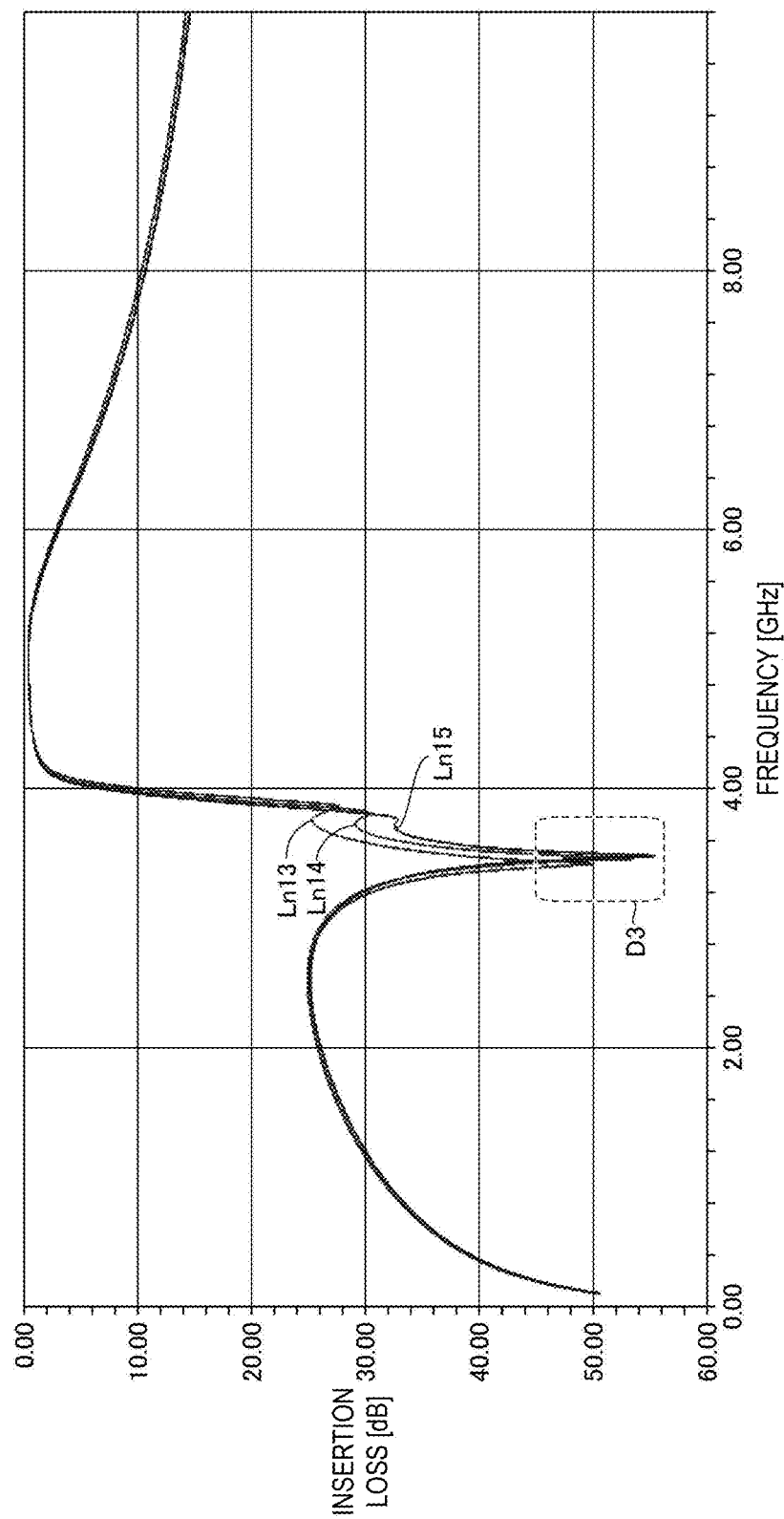
FIG. 10 is a drawing showing insertion losses between an input terminal and an output terminal observed by changing the width in a Y-axis direction of a connection electrode in the filter device illustrated in FIG. 7 and FIG. 8.

FIG. 10 shows insertion losses between the input terminal T1*t* and the output terminal T2*t* observed by changing the width of the connection electrode CPt in the Y-axis direction in the filter device 103 illustrated in FIG. 7 and FIG. 8. In FIG. 10, solid lines Ln13 through Ln15 indicate insertion losses of the filter device 103 observed by changing the width of the connection electrode CPt in the Y-axis direction.

The solid line Ln13 indicates an insertion loss of the filter device 103 in FIG. 8. The solid line Ln14 indicates an insertion loss observed when the width of the connection electrode CPt is wider than the width of the connection electrode CPt of the filter device 103 in FIG. 8. The solid line Ln15 indicates an insertion loss observed when the width of the connection electrode CPt is even wider than the width of the connection electrode CPt in the case of the solid line Ln14.

Each of the solid lines Ln10 through Ln12 has an attenuation pole D3. As the width of the connection electrode CPt in the Y-axis direction increases, the attenuation at the attenuation pole D3 increases, and the frequency of the attenuation pole D3 becomes higher. Also, as the width of the connection electrode CPt in the Y-axis direction decreases, the attenuation at the attenuation pole D3 decreases, and the frequency of the attenuation pole D3 becomes lower.

Thus, in the filter device 103 of the second preferred embodiment, the attenuation and the frequency band of the attenuation pole D3 can be adjusted by changing the positions of the joints J1*t* and J2*t* and the width of the connection electrode CPt in the Y-axis direction. That is, in the filter device 103 of the second preferred embodiment, the capacitance of the capacitor Cx and the inductances of the inductor L2 and the inductor L3 can be used as parameters of electromagnetic field coupling between resonators. This in turn makes it possible to enhance even the adjustability of electromagnetic field coupling between three stages of LC parallel resonators described in the second preferred embodiment and thus makes it possible to increase the possibility to achieve a desired band-pass characteristic.

The resonators RC1 through RC3 in the second preferred embodiment correspond, respectively, to "first LC parallel resonator" through "third LC parallel resonator". The planar electrodes P1*t* through P3*t* correspond to "first conductor" through "third conductor", respectively. The vias V1*t* and V2*t* correspond to "first via" and "second via", respectively. The connection electrode CPt corresponds to "connection conductor".

Third Preferred Embodiment

In the second preferred embodiment, the filter device 103 including three stages of LC parallel resonators, for example, is described. In a third preferred embodiment, a filter device 104 including, for example, four stages of LC parallel resonators is described with reference to FIG. 11 and FIG. 12.

Figure 11:
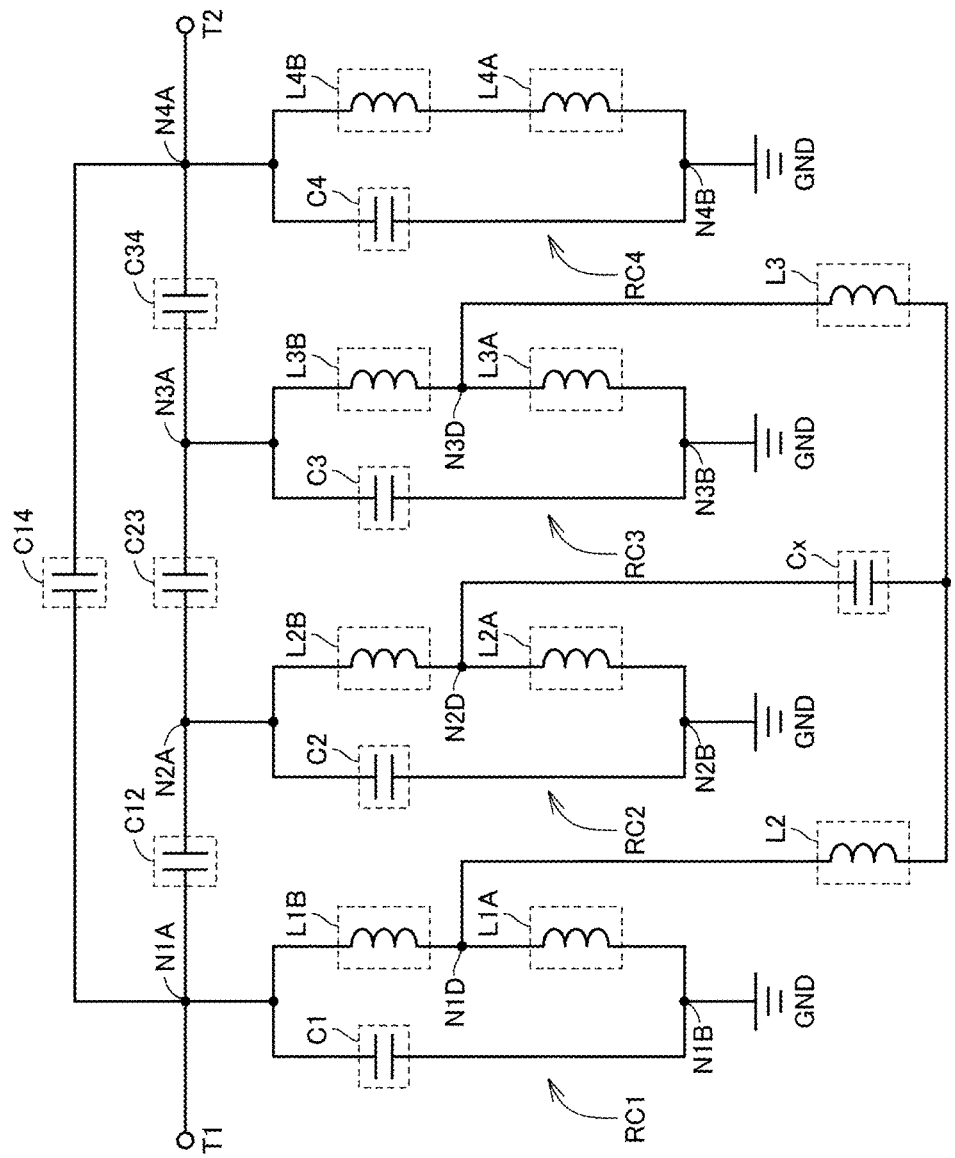
FIG. 11 is an equivalent circuit diagram of a filter device according to a third preferred embodiment of the present invention.

FIG. 11 is an equivalent circuit diagram of the filter device 104 according to the third preferred embodiment. The filter device 104 in FIG. 11 has a configuration obtained by adding the resonator RC4 to the filter device 103 in FIG. 7. That is, the filter device 104 has a configuration including four stages of resonators RC1 through RC4 that are magnetically coupled to each other. The connection node N3A between the inductor L3B and the capacitor C3 is connected via a capacitor C34 to the connection node N4A between the inductor L4B and the capacitor C4. The connection node NIA between the inductor L1A and the capacitor C1 is connected to the connection node N3A in the second preferred embodiment, but is connected via the capacitor C14 to the connection node N4A in the third preferred embodiment.

Figure 12:
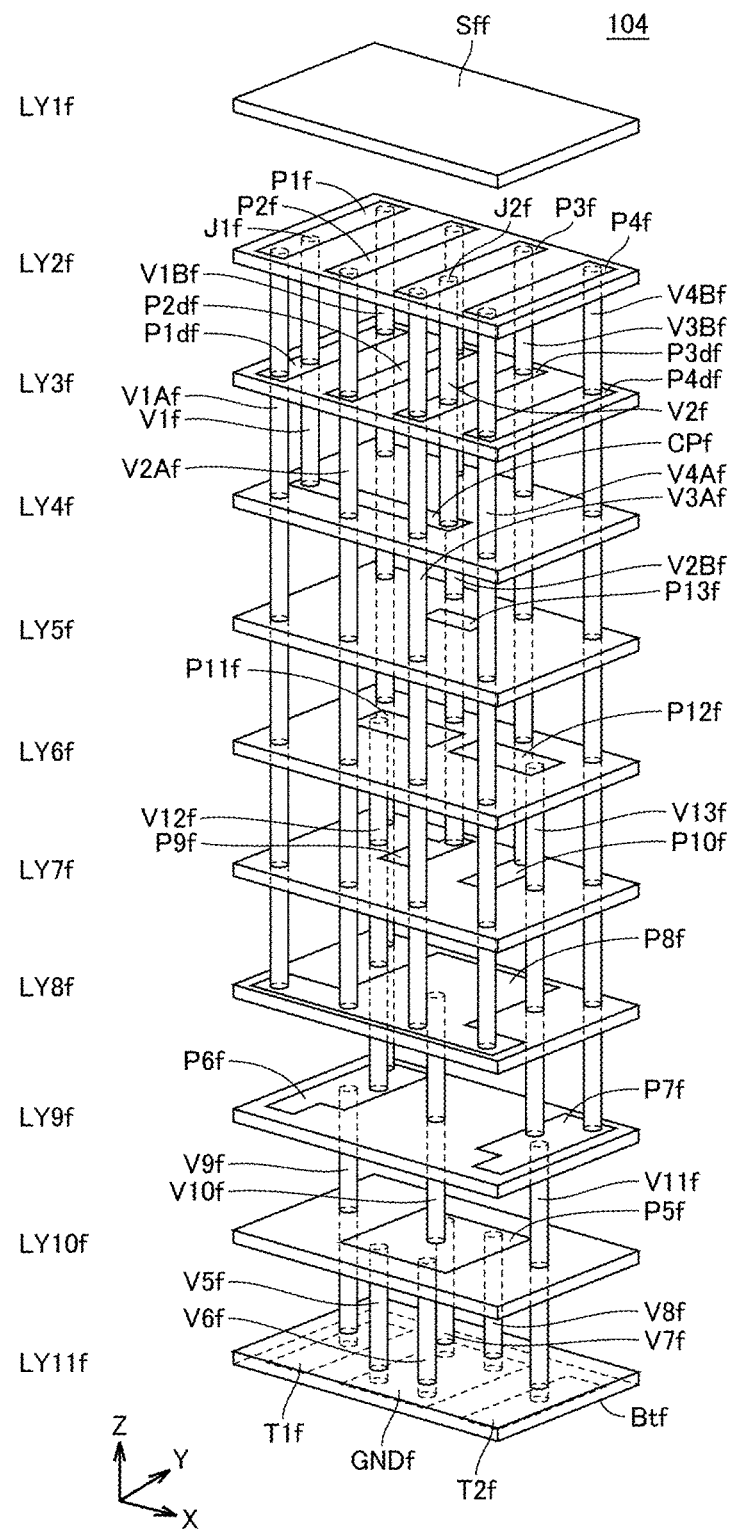
FIG. 12 is an exploded perspective view of an example of a multilayer structure of the filter device according to the third preferred embodiment of the present invention.

Even with a configuration including four stages of resonators RC1 through RC4, the attenuation and the frequency of the attenuation pole can be adjusted by changing the positions of joints J1*f* and J2*f* and the width in the Y-axis direction of a connection electrode CPf illustrated in FIG. 12.

FIG. 12 is an exploded perspective view of an example of a multilayer structure of the filter device 104 according to the third preferred embodiment. The filter device 104 in FIG. 12 includes four stages of LC parallel resonators, for example. More specifically, the filter device 104 includes the resonator RC1 including vias V1A*f* and V1B*f*, a planar electrode P1*f*, a planar electrode Pd*f*, and a planar electrode P6*f*; the resonator RC2 including vias V2A*f* and V2B*f*, a planar electrode P2*f*, a planar electrode P2d*f*, and a planar electrode P9*f*; the resonator RC3 including vias V3A*f* and V3B*f*, a planar electrode P3*f*, a planar electrode P3d*f*, and a planar electrode P10*f*; and the resonator RC4 including vias V4A*f* and V4B*f*, a planar electrode P4*f*, a planar electrode P4d*f*, and a planar electrode P7*f*.

The planar electrode P6*f* of the resonator RC1 is located on a ninth layer LY9*f*. The planar electrode P6*f* is connected through a via V9*f* to an input terminal T1*f* located on an eleventh layer LY11*f*. The planar electrode P6*f* of the resonator RC1 is connected through the via V1B*f* to the planar electrode P1d*f* located on a third layer LY3*f* and the planar electrode P1*f* located on a second layer LY2*f*. Also, the planar electrode P1*f* is connected through a via V1A*f* to a planar electrode P8*f* located on an eighth layer LY8*f*. The planar electrode P8*f* is connected through a via V10*f* to a planar electrode P5*f* located on a tenth layer LY10*f*. Also, the planar electrode P5*f* is connected through vias V5*f*, V6*f*, V7*f*, and V8*f* to a ground terminal GNDf located on the eleventh layer LY11*f*. In plan view seen in the stacking direction, a portion of the planar electrode P6*f* overlaps the planar electrode P8*f*. The capacitor C1 in FIG. 11 includes the planar electrode P6*f* and the planar electrode P8*f*.

The planar electrode P9*f* of the resonator RC2 is connected through the via V2B*f* to the planar electrode P2d*f* located on the third layer LY3*f* and the planar electrode P2*f* located on the second layer LY2f. Also, the planar electrode P2f is connected through the via V2Af to the planar electrode P8f located on the eighth layer LY8f. In plan view seen in the stacking direction, a portion of the planar electrode P8f overlaps the planar electrode P9f. The capacitor C2 in FIG. 11 includes the planar electrode P8f and the planar electrode P9f.

The planar electrode P10f of the resonator RC3 is connected through the via V3Bf to the planar electrode P3df located on the third layer LY3f and the planar electrode P3f located on the second layer LY2f. Also, the planar electrode P3f is connected through the via V3Af to the planar electrode P8f located on the eighth layer LY8f. In plan view seen in the stacking direction, a portion of the planar electrode P8f overlaps the planar electrode P10f. The capacitor C3 in FIG. 11 includes the planar electrode P8f and the planar electrode P10f.

The planar electrode P7f of the resonator RC4 is located on the ninth layer LY9f. The planar electrode P7f is connected through a via V11f to an output terminal T2f located on the eleventh layer LY11f. The planar electrode P7f of the resonator RC4 is connected through the via V4Bf to the planar electrode P4df located on the third layer LY3f and the planar electrode P4f located on the second layer LY2f. Also, the planar electrode P4f is connected through the via V4Af to the planar electrode P8f located on the eighth layer LY8f. In plan view seen in the stacking direction, a portion of the planar electrode P8f overlaps the planar electrode P7f. The capacitor C4 in FIG. 11 includes the planar electrode P7f and the planar electrode P8f.

In plan view seen in the stacking direction, a portion of the planar electrode P9f of the resonator RC2 overlaps a planar electrode P11f located on a sixth layer LY6f. The planar electrode P11f is connected through a via V12f to the planar electrode P6f of the resonator RC1. The capacitor C12 in FIG. 11 includes the planar electrode P9f and the planar electrode P11f. In plan view seen in the stacking direction, a portion of the planar electrode P10f of the resonator RC3 overlaps a planar electrode P12f located on the sixth layer LY6f. The planar electrode P12f is connected through a via V13f to the planar electrode P7f of the resonator RC4. The capacitor C34 in FIG. 11 includes the planar electrode P10f and the planar electrode P12f. Also, the capacitor C14 in FIG. 11 includes the planar electrode P11f, the planar electrode P12f, and a planar electrode P13f located on a fifth layer LY5f. Also, the capacitor C23 in FIG. 11 includes the planar electrode P9f, the planar electrode P10f, the planar electrode P11f, the planar electrode P12f, and the planar electrode P13f.

The planar electrode P1df of the resonator RC1 is connected through a via V1f to the connection electrode CPf located on a fourth Layer LY4f. Also, the planar electrode P3df of the resonator RC3 is connected through a via V2f to the connection electrode CPf. The via V1f and the via V2f correspond to the inductor L2 and the inductor L3 in FIG. 11, respectively. In plan view seen in the stacking direction, a portion of the connection electrode CPf overlaps the planar electrode P2df of the resonator RC2. The capacitor Cx in FIG. 11 includes the connection electrode CPf and the planar electrode P2df.

The via V1f is connected to the planar electrode P1f at the joint J1f. In plan view of the multilayer body seen in the stacking direction, the joint between the via V1f and the planar electrode P1df overlaps the joint J1f. The via V2f is connected to the planar electrode P3f at the joint J2f. In plan view of the multilayer body seen in the stacking direction, the joint between the via V2f and the planar electrode P3df overlaps the joint J2f.

Thus, in the filter device 104 configured to include the connection electrode CPf that overlaps the planar electrode P2df in plan view seen in the stacking direction, the attenuation and the frequency band of the attenuation pole can be adjusted by changing the positions of the joints J1f and J2f and the width of the connection electrode CPf. That is, the capacitance of the capacitor Cx and the inductances of the inductor L2 and the inductor L3 can be used as parameters of electromagnetic field coupling between resonators. This in turn makes it possible to enhance even the adjustability of electromagnetic field coupling between four stages of LC parallel resonators described in the third preferred embodiment and thus makes it possible to increase the possibility to achieve a desired band-pass characteristic.

Here, the resonators RC1 through RC4 correspond to "first LC parallel resonator" through "fourth LC parallel resonator", respectively. The planar electrodes P1df through P3df correspond to "first conductor" through "third conductor", respectively. The vias V1f and V2f correspond to "first via" and "second via", respectively. The connection electrode CPf corresponds to "connection conductor".

First Variation

Figure 13:
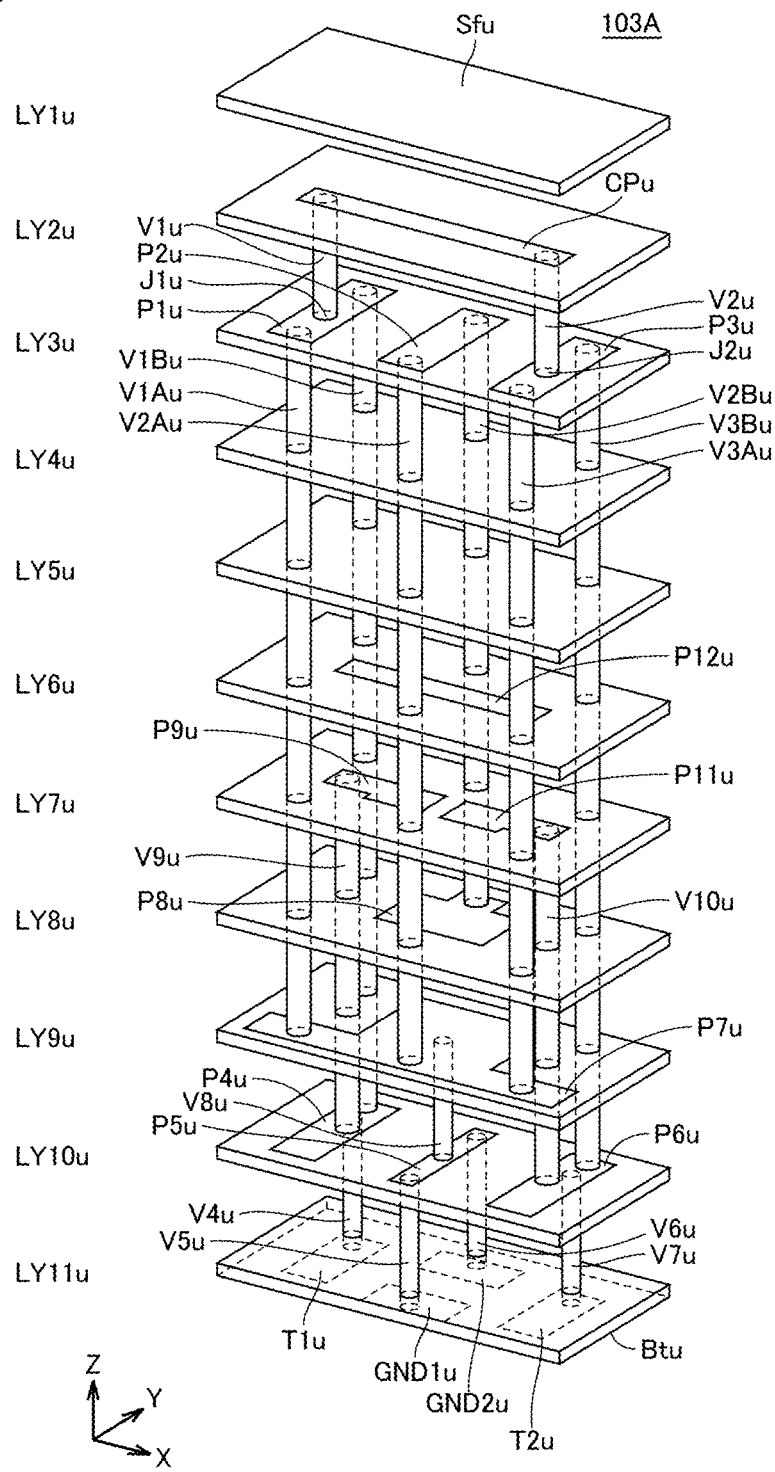
FIG. 13 is an exploded perspective view illustrating a first variation.

FIG. 13 is an exploded perspective view illustrating a first variation of a preferred embodiment of the present invention. In a filter device 103A of the first variation, compared to the filter device 103 illustrated in FIG. 8, a connection electrode CPu is positioned further in the positive direction of the Z axis than a planar electrode P2u. That is, the connection electrode CPu is located on a second layer LY2u. The planar electrode P2u is located on a third layer LY3u. In other words, in the stacking direction, the planar electrode P2u is located between ground terminals GND1u and GND2u and the connection electrode CPu. A via V1u and a via V2u are located between the second layer LY2u and the third layer LY3u.

With this configuration, while the filter device 103A illustrated in FIG. 13 has characteristics similar to those of the filter device 103 illustrated in FIG. 8, the via V1u is located between layers that are different from the layers between which vias V1Au and V1Bu are provided. This configuration of the filter device 103A makes it possible to prevent the occurrence of electrical interference between the via V1u and the vias V1Au and V1Bu. Similarly, this configuration of the filter device 103A makes it possible to prevent the occurrence of electrical interference between a via V2u and vias V2Au and V2Bu.

Also, in the filter device 103A, because the via V1u is located between layers that are different from the layers between which the vias V1Au and V1Bu are provided, these vias do not physically interfere with each other. Therefore, a range, within which the positions of joints J1u and J2u on planar electrodes P1u and P2u are changeable in the Y-axis direction, becomes wider compared with the filter device 103 in FIG. 8. In other words, with the filter device 103A, the positional flexibility of the via V1u and the via V2u is improved.

Also, the filter device 103A of the first variation is configured such that the connection electrode CPu overlaps the planar electrode P2u in plan view seen in the stacking direction. This configuration makes it possible to adjust the attenuation and the frequency band of the attenuation pole. That is, the capacitance of the capacitor Cx and the inductances of the inductor L2 and the inductor L3 can be used as parameters of electromagnetic field coupling between resonators. This in turn makes it possible to enhance even the adjustability of electromagnetic field coupling between three stages of LC parallel resonators described in the first variation and thus makes it possible to increase the possibility to achieve a desired band-pass characteristic.

The planar electrodes P1u through P3u correspond to "first conductor" through "third conductor", respectively. The vias V1u and V2u correspond to "first via" and "second via", respectively. The connection electrode CPu corresponds to "connection conductor".

Second Variation

Figure 14:
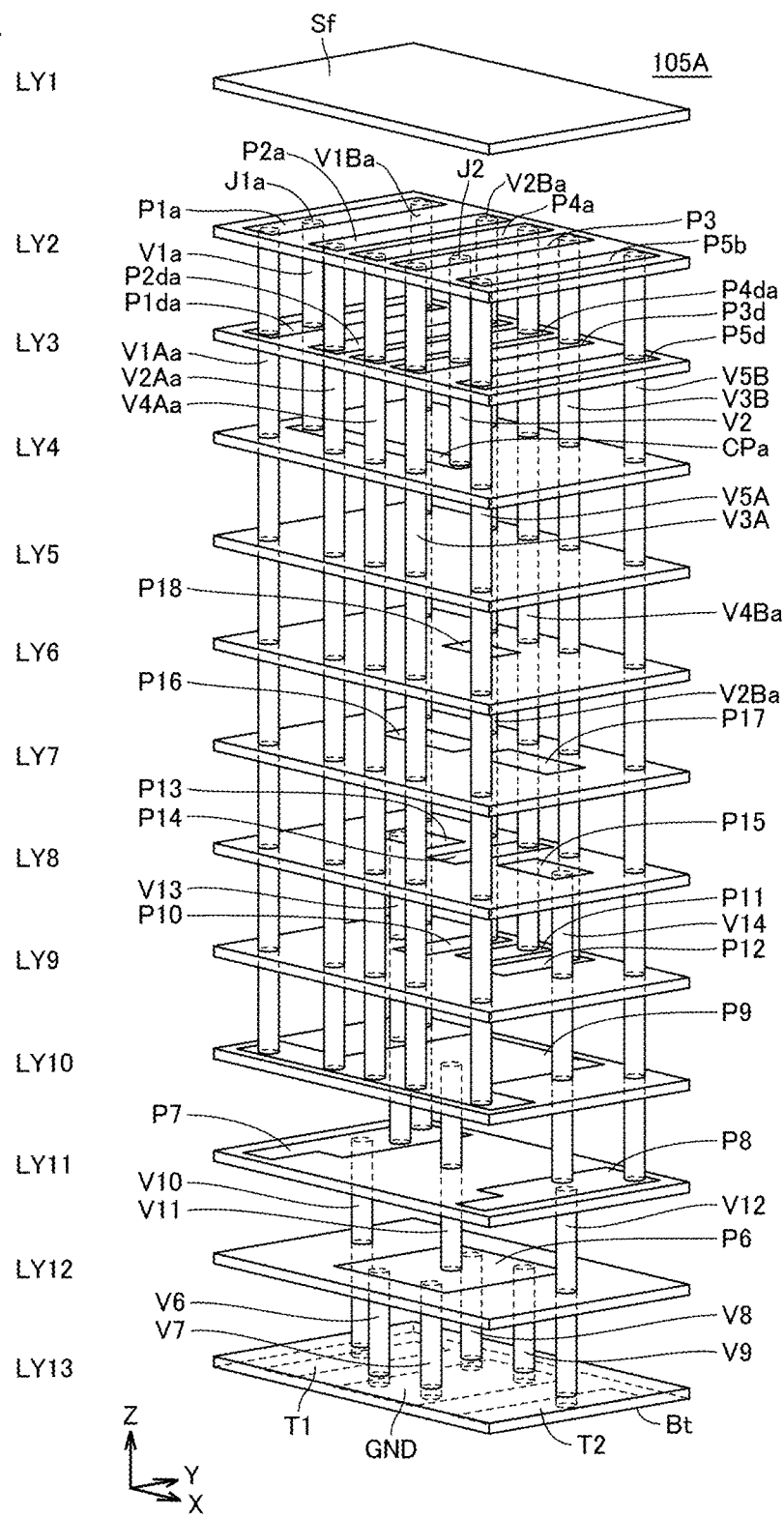
FIG. 14 is an exploded perspective view illustrating a second variation.

FIG. 14 is an exploded perspective view illustrating a second variation of a preferred embodiment of the present disclosure. A filter device 105A of the second variation differs from the filter device 105 of the first preferred embodiment in that the resonator RC4 is disposed between the resonator RC2 and the resonator RC3. That is, while the resonators are arranged in the order RC4, RC1, RC2, RC3, and RC5 in the filter device 105 of the first preferred embodiment, the resonators are arranged in the order RC1, RC2, RC4, RC3, and RC5 in a filter device 105A of the second variation. Also in the filter device 105A, a connection electrode CPa connects the resonator RC1 to the resonator RC3 through vias V1a and V2.

The filter device 105A includes a resonator RC1 including vias V1Aa and V1Ba, a planar electrode P1a, a planar electrode P1da, and a planar electrode P7; a resonator RC2 including vias V2Aa and V2Ba, a planar electrode P2a, a planar electrode P2da, and a planar electrode P10; a resonator RC4 including vias V4Aa and V4Ba, a planar electrode P4a, a planar electrode P4da, and a planar electrode P11; a resonator RC3 including vias V3A and V3B, a planar electrode P3, a planar electrode P3d, and a planar electrode P12; and a resonator RC5 including vias V5A and V5B, a planar electrode P5, a planar electrode P5d, and a planar electrode P8.

Even in the filter device 105A in which the resonator RC4 is disposed between the resonator RC2 and the resonator RC3, the attenuation and the frequency band of the attenuation pole can be adjusted as in the first preferred embodiment by changing the positions of joints J1a and J2 and the width of the connection electrode CPa in the Y-axis direction. This in turn makes it possible to enhance even the adjustability of electromagnetic field coupling between four stages of LC parallel resonators described in the second variation and thus makes it possible to increase the possibility to achieve a desired band-pass characteristic.

Figure 15:
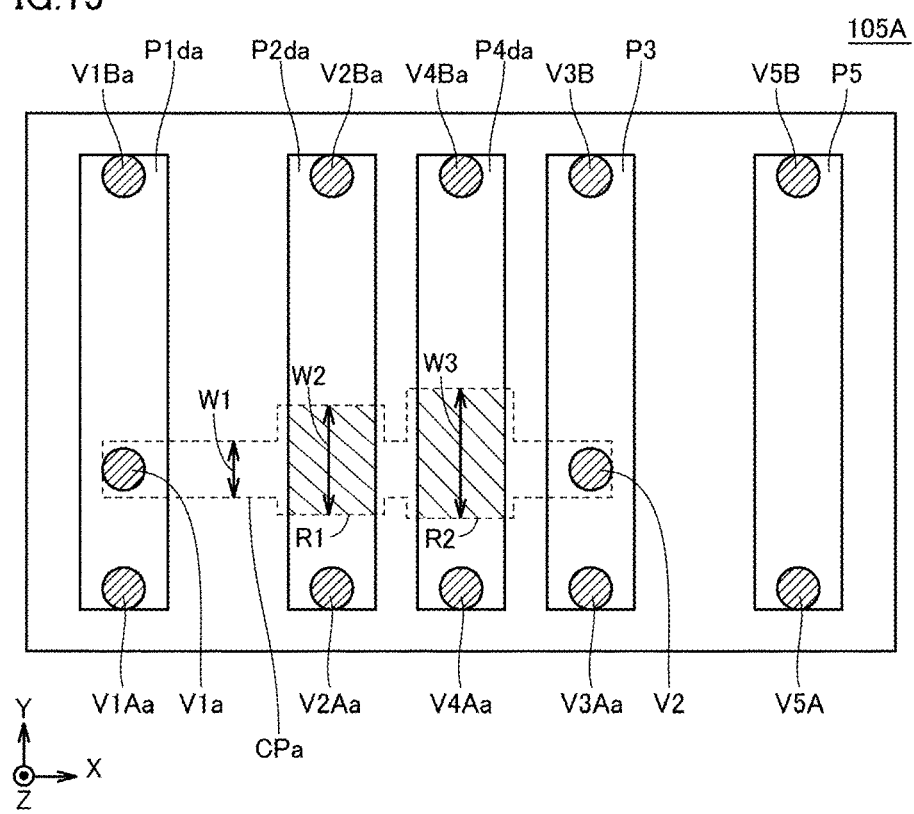
FIG. 15 is a plan view of a connection electrode included in the second variation.

FIG. 15 is a plan view of the connection electrode CPa according to the second variation. The width in the Y-axis direction of the connection electrode CP illustrated in FIG. 3 is uniform in the entire region of the connection electrode CP. As described above, in the filter device 105 of the first preferred embodiment, the attenuation and the frequency of the attenuation pole are adjusted by changing the capacitance of the capacitor Cx. In the second variation, the widths in the Y-axis direction of regions R1 and R2 of the connection electrode CPa, which overlap the planar electrodes P2da and P4da in plan view of the multilayer body seen in the stacking direction, are made wider than the widths of regions other than the regions R1 and R2.

In plan view of the multilayer body of FIG. 15, the planar electrodes P1da, P2da, P4da, P3, and P5 and the connection conductor CPa are seen through other components. Referring to FIG. 15, W2 indicates the width of the region R1 of the connection electrode CPa in the Y-axis direction. Also, W3 indicates the width of the region R2 of the connection electrode CPa in the Y-axis direction. In the connection electrode CPa, regions other than those having the width W1 and the width W2 have a width W1.

Thus, in the second variation, it is possible to adjust the capacitances of capacitors defined between the connection electrode CPa and the planar electrodes P2da and P4da by changing the widths of the connection electrode CPa and thus adjust the attenuation and the frequency of the attenuation pole. Also, because only the widths of regions of the connection electrode CPa necessary for the adjustment of capacitances are widened, the cost of the connection electrode CPa is reduced.

Here, the resonators RC1 through RC5 correspond to "first LC parallel resonator" through "fifth LC parallel resonator", respectively. The planar electrodes P1da, P2da, P3d, P4da, and P5d correspond to "first conductor" through "fifth conductor", respectively. The vias V1a and V2 correspond to "first via" and "second via", respectively. The connection electrode CPa corresponds to "connection conductor". The region R1 corresponds to "first region". The width W2 corresponds to "first width". The width W1 corresponds to "second width".

Third Variation

In the first preferred embodiment, a configuration in which two vias V1 and V2 are connected to the connection electrode CP is described. However, the number of vias connected to the connection electrode CP is not limited to two. Below, a configuration in which three vias are connected to the connection electrode CP is described.

Figure 16:
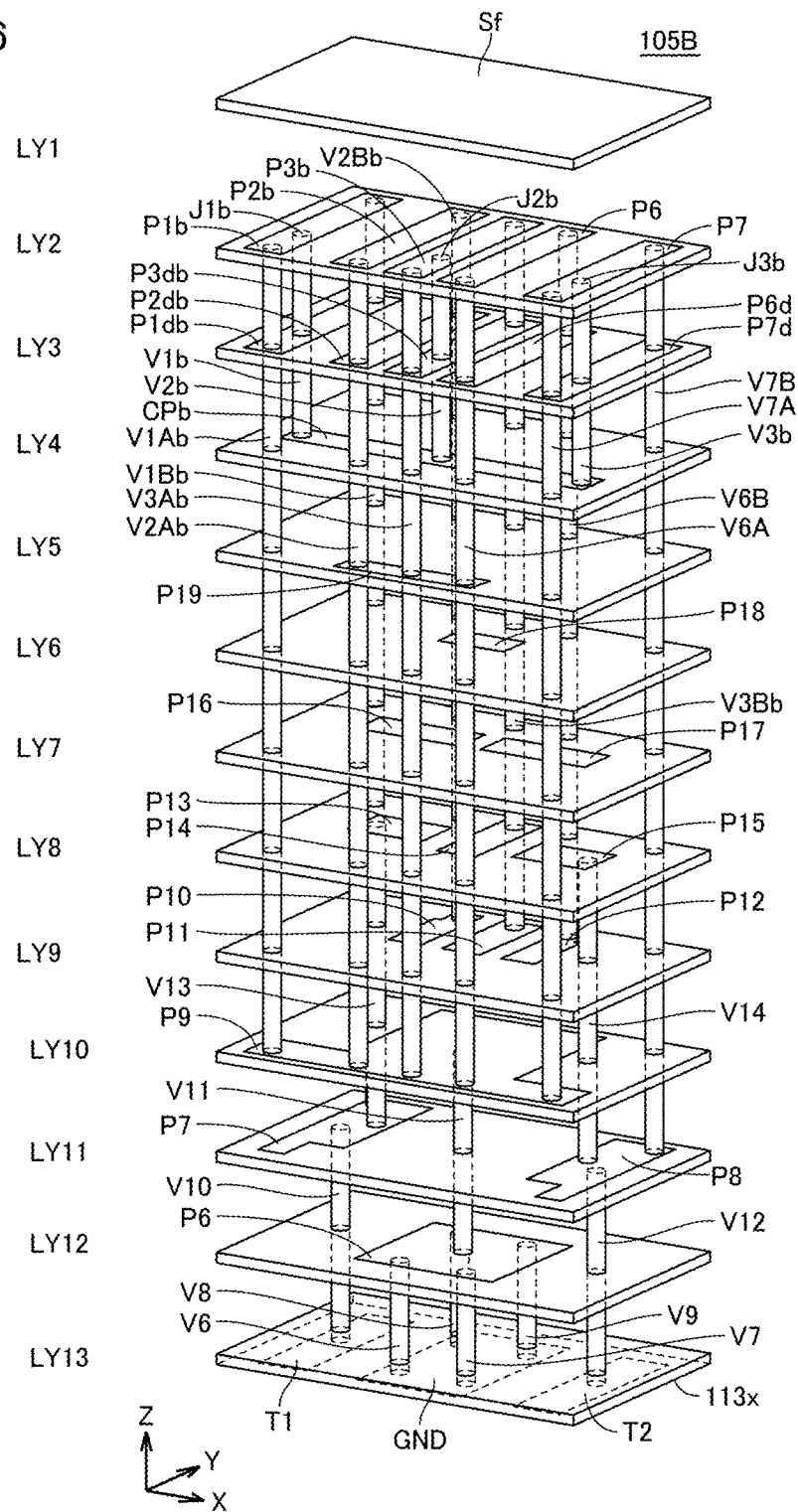
FIG. 16 is an exploded perspective view illustrating a third variation.

FIG. 16 is an exploded perspective view illustrating a third variation of a preferred embodiment of the present disclosure. In a filter device 105B of the third variation, three vias V1b through V3b are connected to a connection electrode CPb. The via V1b is connected to a planar electrode P1b at a joint J1b. The via V2b is connected to a planar electrode P3b at a joint J2b. The via V3b is connected to a planar electrode P7 at a joint J3b. The filter device 105B of the third variation has a configuration obtained by removing the resonators RC4 and RC5 from the filter device 105 in FIG. 3 and by newly adding resonators RC6 and RC7. The capacitor Cx in FIG. 2 is defined between a planar electrode P2db and the connection electrode CPb. Furthermore, in the third variation, a capacitor Cy (not shown) is also defined between a planar electrode P0d and the connection electrode CPb. Thus, compared with the first preferred embodiment, the number of capacitors whose capacitances are changeable by changing the widths of the connection electrode CPb in the Y-axis direction is increased by one. In other words, the number of parameters for adjusting the attenuation and the frequency of the attenuation pole is increased by one.

Also, in the third variation, in addition to the inductor L2 and the inductor L3, an inductor L4 (not shown) corresponding to the via V3b is provided.

In the filter device 105B of the third variation, the capacitance of the capacitor Cy can be adjusted in addition to the capacitance of the capacitor Cx, and the inductor L4 can be adjusted in addition to the inductor L2 and the inductor L3. This makes it possible to more finely adjust the attenuation and the frequency of the attenuation pole.

In the example described with reference to FIG. 3, the positions of the via V1, the connection electrode CP, and the via V2 are changed to slide in the Y-axis direction while the shapes of the via V1, the connection electrode CP, and the via V2 illustrated in FIG. 3 are maintained. However, only the position of one of the joints J1 and J2 may be changed and also, the positions of the joints J1 and J2 in the Y-axis direction may be changed to positions that are different from each other.

Figure 17:
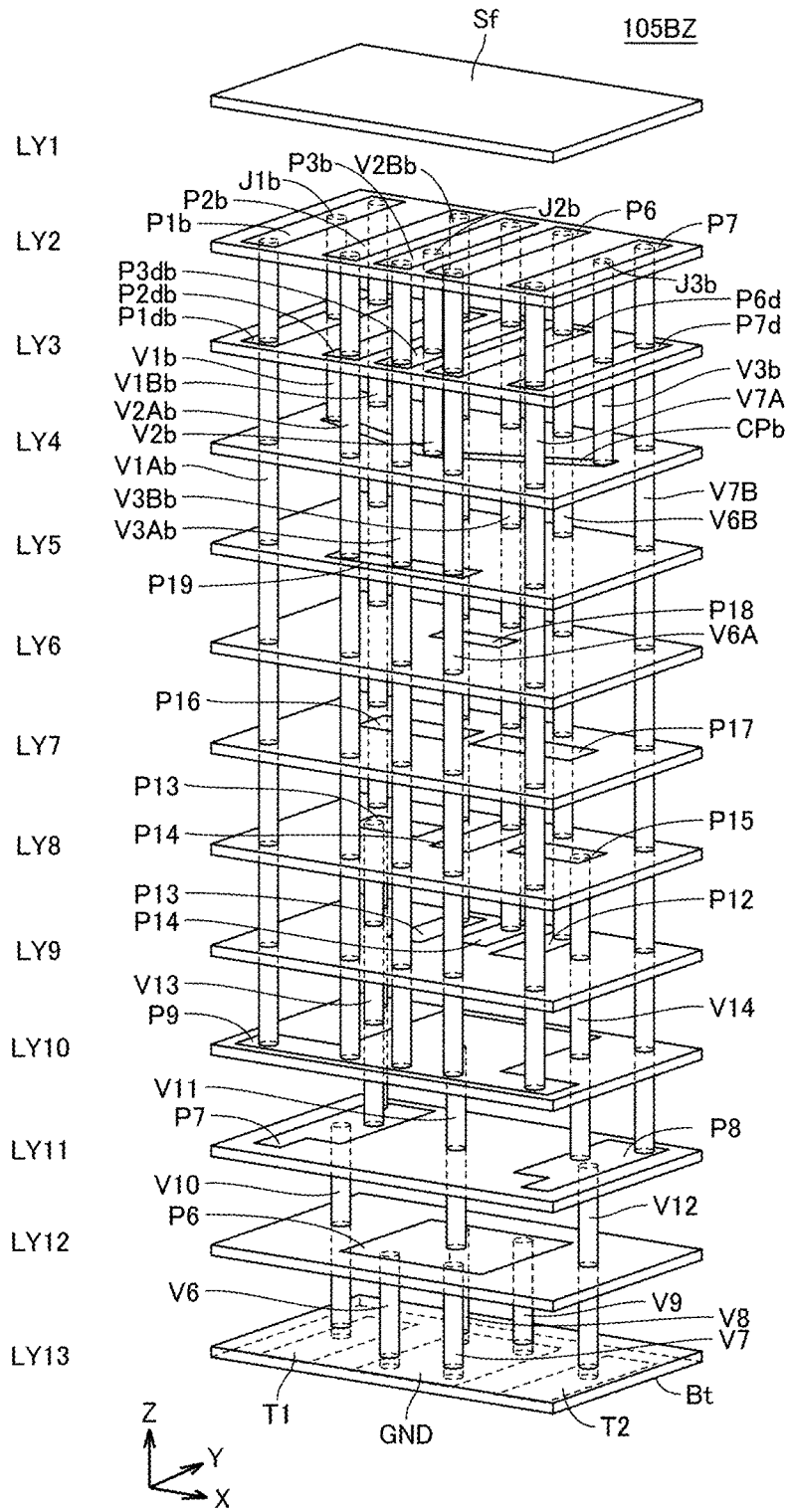
FIG. 17 is an exploded perspective view illustrating an adjustment example in the third variation.

FIG. 17 is an exploded perspective view illustrating an adjustment example in the third variation. A filter device 105BZ in FIG. 17 is an example obtained by adjusting joints J1b and J3b of the filter device 105B in FIG. 16. On the planar electrodes P1b and P7, the joints J1b and J3b in FIG. 17 are positioned further in the positive direction of the Y axis than the joints J1b and J3b in FIG. 16. Accordingly, the vias V1b and V2b are positioned further in the positive direction of the Y axis, and the connection electrode CPb has a V shape or substantially a V shape.

As described above, in the filter device 105BZ of this disclosure, it is possible to more finely adjust the attenuation and the frequency of the attenuation pole by separately adjusting the joints J1b through J3b and thus adjusting inductors and capacitors.

The planar electrodes P1db, P2db, and P3db correspond to "first conductor" through "third conductor", respectively. The planar electrodes Pod and P7d correspond to "sixth conductor" and "seventh conductor", respectively. The vias V1b through V3b correspond to "first via" through "third via", respectively. The connection electrode CPb corresponds to "connection conductor".

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a multilayer body in which multiple dielectric layers are stacked in stacking direction;
   a ground terminal; and
   a first LC parallel resonator, a second LC parallel resonator, and a third LC parallel resonator located in the multilayer body and magnetically coupled to each other; wherein
   each of the first LC parallel resonator, the second LC parallel resonator, and the third LC parallel resonator is connected to the ground terminal;
   the first LC parallel resonator includes a first conductor, the second LC parallel resonator includes a second conductor, and the third LC parallel resonator includes a third conductor;
   the filter device further comprises:
      a connection conductor on a layer different from a layer on which the second conductor is located;
      a first via including one end connected to the first conductor and another end connected to the connection conductor; and
      a second via including one end connected to the third conductor and another end connected to the connection conductor; and
   the connection conductor includes a first region that overlaps a portion of the second conductor in plan view of the multilayer body seen in the stacking direction such that the connection conductor is capacitively coupled to the second conductor.

2. The filter device according to claim 1, wherein the second conductor is between the ground terminal and the connection conductor in the stacking direction.

3. The filter device according to claim 1, wherein
   the connection conductor further includes a second region that does not overlap the second conductor in plan view of the multilayer body seen in the stacking direction;
   a first width of the first region and a second width of the second region are widths in a direction perpendicular or substantially perpendicular to a direction in which the connection conductor extends from the first via toward the second via in a plane of the layer on which the connection conductor is located; and
   the first width is wider than the second width.

4. The filter device according to claim 1, further comprising:
   a fourth LC parallel resonator that is magnetically coupled to the first LC parallel resonator, the second LC parallel resonator, and the third LC parallel resonator.

5. The filter device according to claim 4, wherein the fourth LC parallel resonator is between the first LC parallel resonator and the third LC parallel resonator.

6. The filter device according to claim 4, further comprising:
   a fifth LC parallel resonator magnetically coupled to the first LC parallel resonator, the second LC parallel resonator, the third LC parallel resonator, and the fourth LC parallel resonator.

7. The filter device according to claim 1, further comprising:
   a sixth LC parallel resonator and a seventh LC parallel resonator that are magnetically coupled to the first LC parallel resonator, the second LC parallel resonator, and the third LC parallel resonator, the sixth LC parallel resonator including a sixth conductor, the seventh LC parallel resonator including a seventh conductor; and
   a third via including one end connected to the seventh conductor included in the seventh LC parallel resonator and another end connected to the connection conductor; wherein
   the connection conductor includes a third region that overlaps a portion of the sixth conductor in plan view of the multilayer body seen in the stacking direction.

8. The filter device according to claim 1, wherein the filter device is a band-pass filter to transmit a signal in a specific frequency band.

9. The filter device according to claim 1, wherein the filter device includes a total of five stages of LC parallel resonators.

10. The filter device according to claim 1, wherein the filter device includes a total of three stages of LC parallel resonators.

11. The filter device according to claim 1, wherein the filter device includes a total of four stages of LC parallel resonators.

12. A filter device comprising:
   a ground terminal; and
   multiple LC parallel resonators each of which is connected to the ground terminal, the multiple LC parallel resonators being electrically connected to each other; wherein
   the multiple LC parallel resonators include a first LC parallel resonator, a second LC parallel resonator, and a third LC parallel resonator;
   each of the multiple LC parallel resonators includes a first inductor and a second inductor that are connected in series and a first capacitor, and is connected to the ground terminal at a connection node between the first inductor and the first capacitor; and
   the filter device further comprises:
      a third inductor and a fourth inductor that are connected in series between a connection node between the first inductor and the second inductor of the first LC parallel resonator and a connection node between the first inductor and the second inductor of the third LC parallel resonator; and a second capacitor connected between a connection node between the first inductor and the second inductor of the second LC parallel resonator and a connection node between the third inductor and the fourth inductor.

13. The filter device according to claim 12, wherein the filter device is a band-pass filter to transmit a signal in a specific frequency band.

14. The filter device according to claim 12, wherein the filter device includes a total of five stages of LC parallel resonators.

15. The filter device according to claim 12, wherein the filter device includes a total of three stages of LC parallel resonators.

16. The filter device according to claim 12, wherein the filter device includes a total of four stages of LC parallel resonators.

17. A radio-frequency front-end circuit comprising:
the filter device according to claim 1; and
an amplifier connected to the filter device.

18. A radio-frequency front-end circuit comprising:
the filter device according to claim 12; and
an amplifier connected to the filter device.

* * * * *